United States Patent
Kim et al.

(10) Patent No.: US 12,494,430 B2
(45) Date of Patent: Dec. 9, 2025

(54) INTEGRATED CIRCUIT DEVICES INCLUDING LOWER INTERCONNECT METAL LAYERS AT CELL BOUNDARIES AND METHODS OF FORMING THE SAME

(71) Applicant: Samsung Electronics Co., Ltd., Suwon-si (KR)

(72) Inventors: Jintae Kim, Clifton Park, NY (US); Panjae Park, Halfmoon, NY (US); Kang-Ill Seo, Springfield, VA (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/752,851

(22) Filed: Jun. 25, 2024

(65) Prior Publication Data

US 2025/0105153 A1    Mar. 27, 2025

Related U.S. Application Data

(60) Provisional application No. 63/585,747, filed on Sep. 27, 2023.

(51) Int. Cl.
*H01L 23/528* (2006.01)
*H01L 23/48* (2006.01)
*H10D 84/85* (2025.01)

(52) U.S. Cl.
CPC ........ *H01L 23/5286* (2013.01); *H01L 23/481* (2013.01); *H10D 84/856* (2025.01)

(58) Field of Classification Search
CPC . H01L 23/5286; H01L 23/481; H01L 23/535; H10D 84/856; H10D 84/038; H10D 84/85; H10D 88/00; H10D 89/10; H10D 84/853; G06F 30/392; G06F 30/3953

USPC .......................................... 257/369; 438/199
See application file for complete search history.

(56) References Cited

U.S. PATENT DOCUMENTS

| | | |
|---|---|---|
| 10,242,985 B2 | 3/2019 | Shimbo |
| 11,068,640 B2 | 7/2021 | Kumar et al. |
| 11,756,952 B2 | 9/2023 | Chang et al. |
| 2016/0117431 A1 | 4/2016 | Kim et al. |

(Continued)

OTHER PUBLICATIONS

Extended European Search Report corresponding to 24200495.0; Dated: Mar. 24, 2025, 9 pp.

(Continued)

*Primary Examiner* — Didarul A Mazumder
(74) *Attorney, Agent, or Firm* — Myers Bigel, P.A.

(57) ABSTRACT

Integrated circuit devices are provided. An integrated circuit device includes a substrate and a cell that has a plurality of transistors. The transistors include an upper transistor having an upper channel region. Moreover, the transistors include a lower transistor between the substrate and the upper transistor. The lower transistor includes a lower channel region. The integrated circuit device includes a power line extending longitudinally in a first horizontal direction below the substrate and defining a cell boundary of the cell that extends longitudinally in the first horizontal direction. The integrated circuit device includes a cell boundary signal metal pattern on the cell and extending longitudinally in the first horizontal direction over the cell boundary and connected to at least two transistors of the plurality of transistors. Related methods of forming integrated circuit devices are also provided.

16 Claims, 15 Drawing Sheets

(56) References Cited

U.S. PATENT DOCUMENTS

| | | |
|---|---|---|
| 2020/0105670 A1* | 4/2020 | Zhu ................ H01L 21/823821 |
| 2021/0343715 A1 | 11/2021 | Wu et al. |
| 2021/0343744 A1 | 11/2021 | Chiu et al. |
| 2022/0181258 A1 | 6/2022 | Liebmann et al. |
| 2022/0262791 A1 | 8/2022 | Shi et al. |
| 2023/0161940 A1* | 5/2023 | Hoover ................ G06F 30/392 |
| | | 716/135 |

OTHER PUBLICATIONS

Ryckaert, et al., "Enabling Sub-5nm CMOS Technology Scaling Thinner and Taller!", 2019 IEEE International Electron Devices Meeting (IEDM), San Francisco, CA, USA, 2019, 29.4.1-29.4.4.

\* cited by examiner

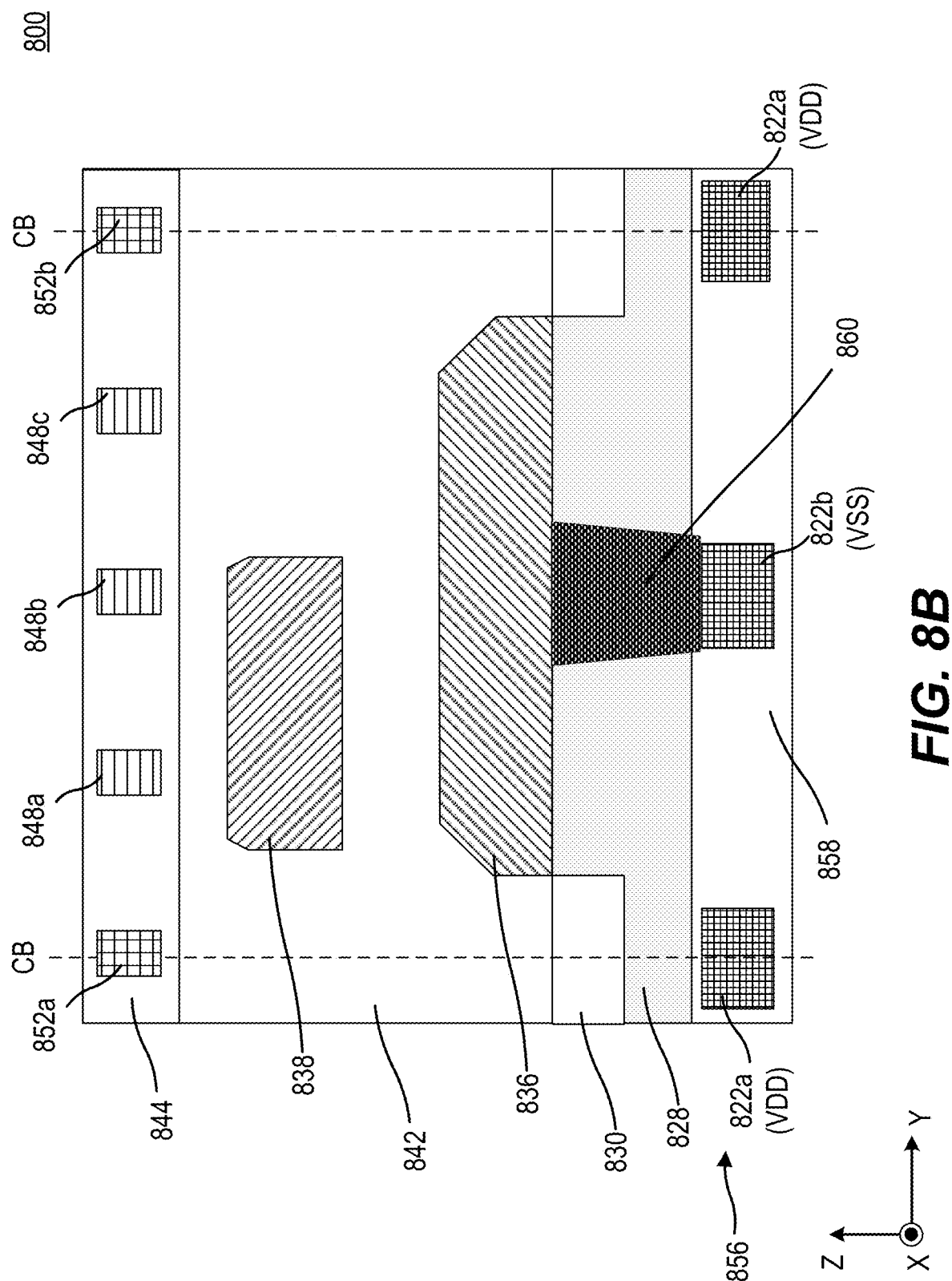

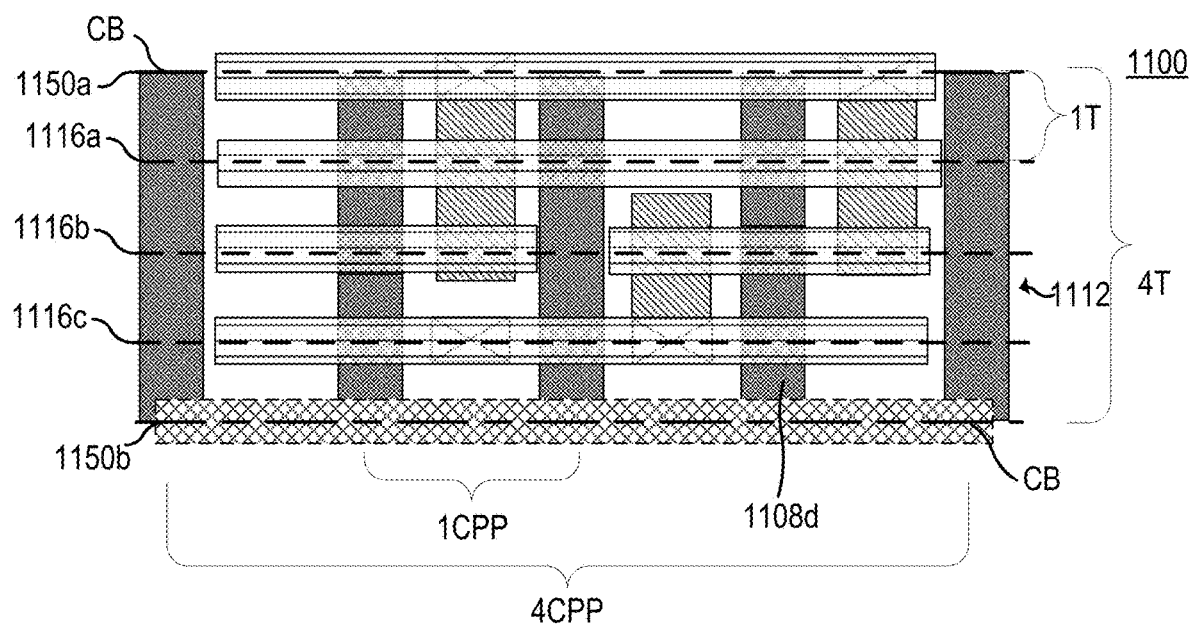
FIG. 11
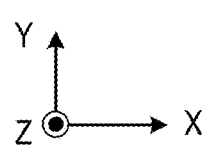

INTEGRATED CIRCUIT DEVICES INCLUDING LOWER INTERCONNECT METAL LAYERS AT CELL BOUNDARIES AND METHODS OF FORMING THE SAME

RELATED APPLICATIONS

This application claims priority to U.S. Provisional Application Ser. No. 63/585,747 entitled INTEGRATED CIRCUIT DEVICES AND METHODS OF FORMING THE SAME, filed in the USPTO on Sep. 27, 2023, the disclosure of which is hereby incorporated by reference herein in its entirety.

BACKGROUND OF THE INVENTION

The present disclosure generally relates to the field of integrated circuit devices and, more particularly, to integrated circuit devices including standard cells having lower interconnect metal layers at cell boundaries and methods of forming the same.

As demands for high performance and/or high speed of an integrated circuit device increase, a degree of integration in the integrated circuit device also increases. Various structures of an integrated circuit device and methods of forming the same have thus been proposed to increase the integration density of the integrated circuit device.

SUMMARY OF THE INVENTION

An integrated circuit device, according to some embodiments, may include a substrate and a cell that has a plurality of transistors. The plurality of transistors may include an upper transistor having an upper channel region. Moreover, the plurality of transistors may include a lower transistor between the substrate and the upper transistor. The lower transistor may include a lower channel region. The integrated circuit device may include a power line extending longitudinally in a first horizontal direction below the substrate and defining a cell boundary of the cell that extends longitudinally in the first horizontal direction. The integrated circuit device may include a cell boundary signal metal pattern on the cell and extending longitudinally in the first horizontal direction over the cell boundary and connected to at least two transistors of the plurality of transistors.

An integrated circuit device, according to some embodiments, may include a cell having a plurality of transistors arranged on a first side of a substrate. The plurality of transistors may include an upper transistor having an upper source/drain region. Moreover, the plurality of transistors may include a lower transistor between the substrate and the upper transistor. the lower transistor may include a lower source/drain region. The integrated circuit device may include a back-end-of-line (BEOL) structure having a plurality of metal layers on the first side of the substrate. The upper transistor and lower transistor may be between a lowermost metal layer of the plurality of metal layers and the substrate. The integrated circuit device may include first and second power lines extending longitudinally in a first horizontal direction in parallel on a second side the substrate. The first power line and the second power line may defining respectively a first cell boundary and a second cell boundary of the cell. The lowermost metal layer may have a cell boundary signal metal pattern that extends longitudinally in the first horizontal direction over the first cell boundary and is connected to at least two transistors of the plurality of transistors.

A method of forming an integrated circuit device, according to some embodiments, may include forming a cell on a substrate. The cell may include a plurality of transistors including a lower transistor and an upper transistor on the substrate. The lower transistor may include a lower channel region and the upper transistor may include an upper channel region. The cell may have a cell boundary that extends in a first horizontal direction. The method may include forming a cell boundary metal pattern in a first metal layer above the substrate. The cell boundary metal pattern may extend in the first horizontal direction and may overlap the cell boundary in a vertical direction. The cell boundary metal pattern may interconnect at least two transistors of the plurality of transistors. The cell boundary metal pattern may be connected to at least one of the lower transistor and upper transistor. Moreover, the method may include forming a power line extending longitudinally in the first horizontal direction. The cell boundary metal pattern may overlap the power line and the cell boundary in the vertical direction.

BRIEF DESCRIPTION OF THE DRAWINGS

FIGS. 8B and 8C are cross-sectional views of the standard cell of FIG. 8A taken along the lines B-B and C-C, respectively.

FIG. 11 is a layout view of a standard cell having dimensions in first and second horizontal directions.

DETAILED DESCRIPTION

Figure 1:
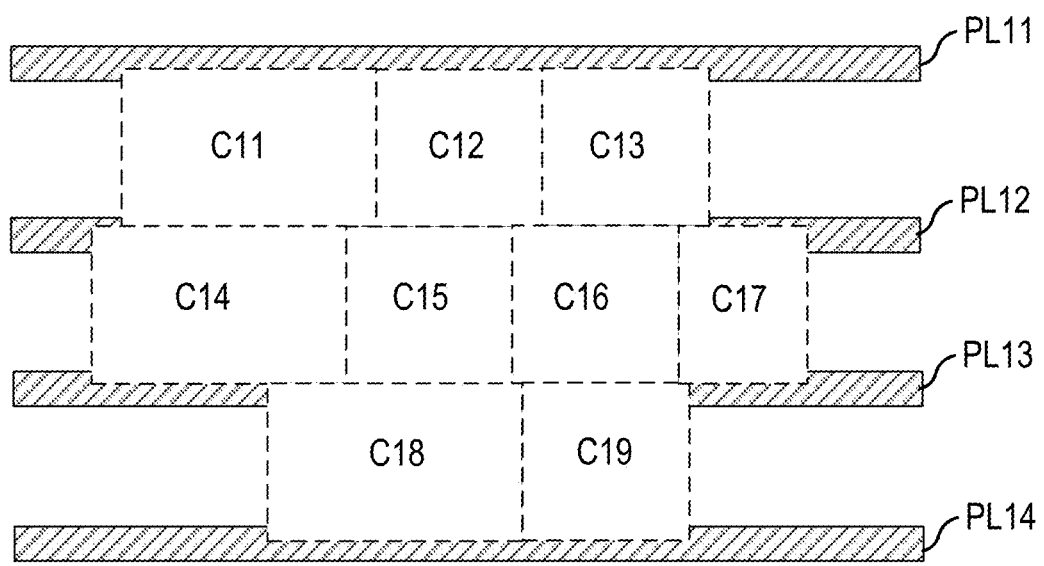
FIG. 1 is a diagram schematically illustrating a portion of an integrated circuit according to some embodiments of the present disclosure.

FIG. 1 is a diagram schematically illustrating a portion of an integrated circuit 100 according to some embodiments of the present disclosure. More particularly, FIG. 1 is a top plan view that illustrates a layout of the integrated circuit 100. The integrated circuit 100 includes a plurality of standard cells C11 through C19 on a plane including an X axis and a Y axis. Herein, an X axis direction may be referred to as a first horizontal axis, first horizontal direction, or first direction, a Y axis direction may be referred to as a second horizontal axis, second horizontal direction, or second direction, and a Z axis direction may be referred to as a vertical axis, vertical direction, or third direction. A plane including the X axis and the Y axis may be referred to as a horizontal plane. A component disposed in a +Z axis direction with respect to another component may be referred to as being on or above the other component, and a component disposed in a −Z axis direction with respect to another component may be referred to as being under or below the other component. Unless otherwise indicated in the specification, a height of a component may indicate a length in the Y axis direction of the component, and a thickness of a component may indicate a length in the Z axis direction of the component. In addition, an area of a component may refer to a size occupied by the component in the horizontal plane and planes parallel to the horizontal plane. In the accompanying drawings of the specification, for convenience of illustration, some layers may be omitted, and for example only some connections between a metal layer pattern and other patterns above and/or below the metal layer pattern are shown.

As shown in the image of FIG. 1, the integrated circuit 100 may include power lines PL11 through PL14 extending in the X axis direction. The power lines PL11 through PL14 may provide a supply voltage for providing power to the first cell C11 through the ninth cell C19 is applied, and the power lines PL11 through PL14 may be arranged on respective power rails of the integrated circuit 100. In some embodiments, different supply voltages may be applied to adjacent power lines PL11 through PL14. For example, a positive supply voltage may be applied to odd-numbered power lines PL11 and PL13, and a ground voltage (or a negative supply voltage) may be applied to even-numbered power lines PL12 and PL14. In some embodiments, the ground voltage may be applied to the odd-numbered power lines PL11 and PL13, and the positive supply voltage may be applied to the even-numbered power lines PL12 and PL14. The power lines PL11 through PL14 may be formed in one or more conductive layers.

Each of plurality of standard cells C11 through C19 may be a unit of a layout included in an integrated circuit, may be designed to perform a predefined function, and may be referred to as a cell. The integrated circuit 10 may include a plurality of various standard cells, and the standard cells may be aligned along a plurality of rows.

The plurality of standard cells may be repeatedly used in an integrated circuit design. The standard cells may be predesigned according to manufacturing technology and stored in a standard cell library, and an integrated circuit may be designed by arranging and interconnecting the standard cells stored in the standard cell library according to a design rule.

For example, the standard cells may include various basic circuits such as inverters, AND gates, NAND gates, OR gates, XOR gates, and NOR gates, which are frequently used in digital circuit designs for electronic apparatuses, such as central processing unit (CPU), graphics processing unit (GPU), and system-on-chip (SOC) designs. Alternatively, for example, the standard cells may include other circuits frequently used in circuit blocks, such as flip-flops and latches.

A standard cell library (or a cell library) D12 (see FIG. 15) may include information regarding the standard cells, for example, function information, characteristics information, and layout information of e.g., the first cell C11 through the ninth cell C19 shown in FIG. 1.

Figure 2:
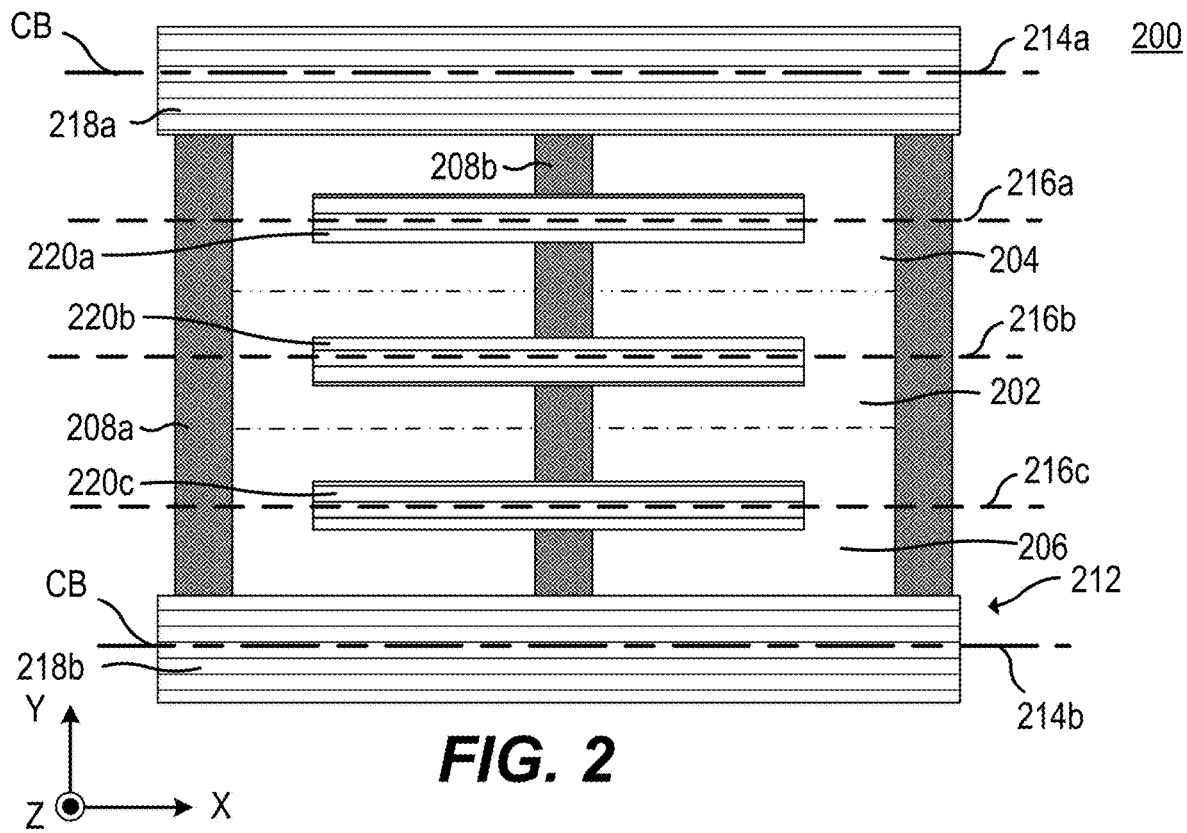
FIGS. 2 and 3 are schematic layouts of portions of integrated circuit devices having front side power distribution networks (FSPDN).
Figure 3:
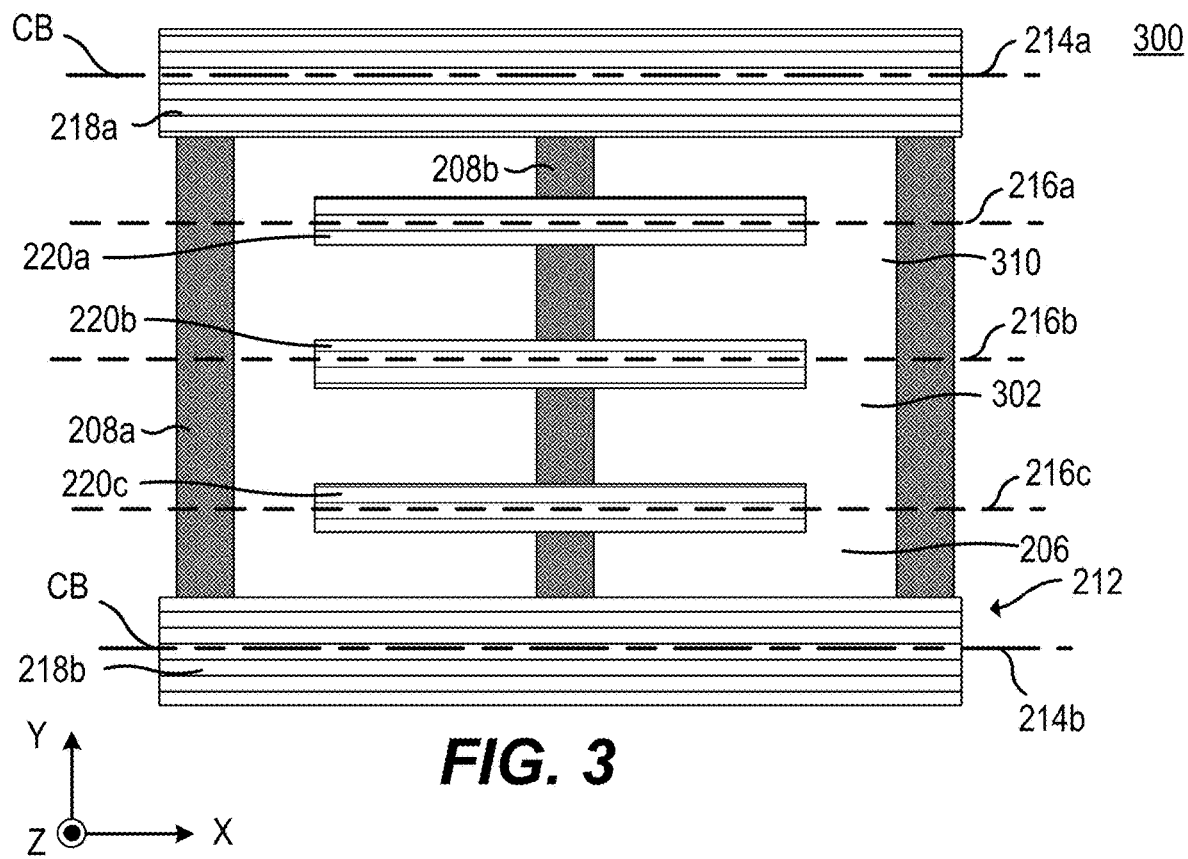

FIGS. 2 and 3 are schematic layout views of portions of integrated circuit devices having front side power distribution networks (FSPDN).

In some embodiments, and with reference to FIG. 2, a layout 200 of a portion of an integrated circuit may include a first active region 204 and a second active region 206 which may be on an upper portion of a substrate 202. The first and second active regions 204 and 206 may be PMOSFET and NMOSFET regions, respectively, although the present disclosure is not limited thereto. The first and second active regions 204 and 206 may extend in the X axis direction. In some embodiments, the first and second active regions 204 and 206 may include vertically protruding portions of the substrate 202. A device isolation layer (not shown) may be between the first and second active regions 204 and 206 The device isolation layer may include a silicon oxide layer.

Transistors (e.g., field-effect transistors, FETs) may be formed in the first and second active regions 204 and 206. More specifically, gate lines 208 and the first and second active regions 204 and 206 may form transistors. The gate lines 208 (e.g., first gate line 208a, second gate line 208b, and so on) may extend in the Y axis direction and may be spaced apart from each other in the X axis direction. In some embodiments, the gate lines 208 may include a work function metal-containing layer and a gap-fill metal layer. For example, the work function metal-containing layer may include at least one metal among Ti, W, Ru, Nb, Mo, Hf, Ni, Co, Pt, Yb, Tb, Dy, Er, and Pd, and the gap-fill metal layer may include a W layer or an Al layer. In some embodiments, the gate lines 208 may include a stack structure of TiAlC/TiN/W, a stack structure of TiN/TaN/TiAlC/TiN/W, or a stack structure of TiN/TaN/TiN/TiAlC/TiN/W.

In some embodiments, and with reference to the layout 300 of FIG. 3, stacked FETs may be included in the standard cells to form logic circuits therein. Stacked FETs are described in greater detail below. A stacked area or stacked region 310 on the substrate 302 may include one or more stacked transistor structures, and transistors may be formed by the gate lines 208 and the stacked area 310. The stacked FETs may reduce a planar area of a standard cell by about half when compared to that of a standard cell including non-stacked FETs, thereby facilitating a higher degree of integration in the integrated circuit device.

In both the layout 200 of FIG. 2 and the layout 300 of FIG. 3, a first metal layer 212 may be provided above the substrate 202. In some embodiments, a plurality of metal layers may be provided above the substrate 202, and the first metal layer 212 may be the lowermost metal layer of the plurality of metal layers or the closest to the substrate 202. The first metal layer 212 may include a plurality of metal tracks 214a, 214b, 216a, 216b, and 216c, with the understanding that the present disclosure is not limited to five metal tracks 214/216 in the first metal layer 212. The plurality of metal tracks 214/216 may extend in parallel to each other in the X axis direction and may be spaced apart from each other in the Y axis direction. The plurality of metal tracks 214/216 may include first and second power tracks 214a and 214b, and a plurality of lower interconnection tracks (with first to third lower inter connection tracks 216a to 216c shown in FIGS. 2 and 3). The first metal layer 212 may also include lower vias not shown in FIGS. 2 and 3. First and second power metal patterns 218a and 218b may be formed on respective first and second power tracks 214a and 214b, and lower interconnection metal patterns 220 (e.g., first lower interconnection pattern 220a) may be formed on each of the plurality of lower interconnection tracks 216a-216c.

Stating the above differently, in layouts 200 and 300 a plurality of lower interconnection tracks 216 may be defined between the first and second power tracks 214a and 214b. The first and second power tracks 214a and 214b may extend in the X axis direction and may be spaced apart from each other in the Y axis direction. In some embodiments, the plurality of lower interconnection tracks 216 may be arranged with different spacing therebetween than between a lower interconnection track (e.g., the first lower interconnection track 216a) and an adjacent one of the first and second power tracks 214a and 214b.

Cell boundaries CB in the layouts 200 and 300 of FIGS. 2 and 3 may be defined by the first and second power tracks 214a and 214b. For example, each cell boundary CB may correspond to a center portion of one of the first power track 214a or the second power track 214b in the Y axis direction. Each of the cell boundaries CB may be an imaginary line that extends in the X axis direction and intersects the center portion of one of the first power lines FSP1 or the second power lines FSP2 in the Y axis direction. Each of the cell boundaries CB may also be an imaginary plane defined by the X axis direction and the Z axis direction. Each of the cell boundaries CB may indicate a boundary (e.g., outermost extent) of the layout 11 or 12 in the Y axis direction.

Figure 4:
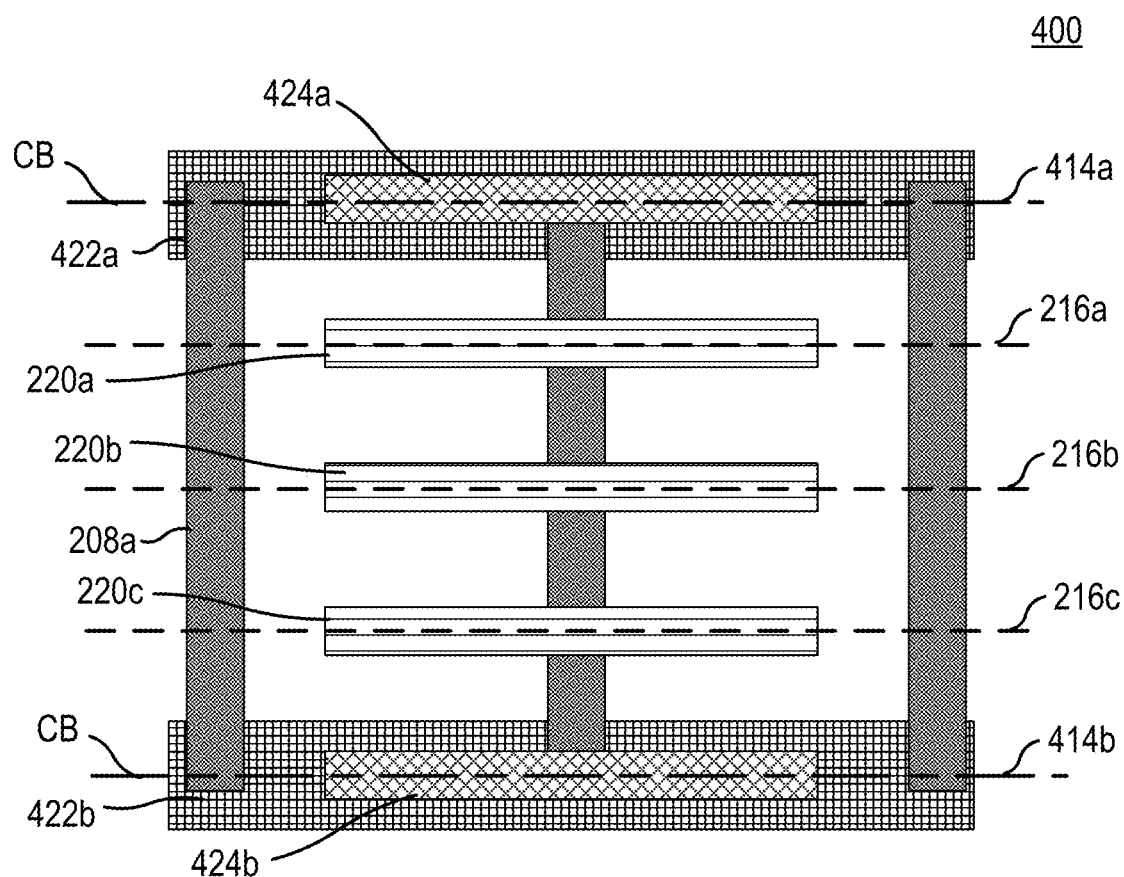
FIG. 4 is a schematic layout of an integrated circuit device having a back side power distribution network (BSPDN).

FIG. 4 is a schematic layout 400 of an integrated circuit device having a back side power distribution network (BSPDN). A BSPDN may provide increased integration and may address power needs within the integrated circuit. The layout 400 of FIG. 1D does not show a substrate, and instead shows first and second power rails 422a and 422b that may contact a lower surface (in the Z axis direction) of the substrate. Each of first and second power rails 422a and 422b may each be electrically connected to a power source and provide a predetermined voltage (e.g., a drain voltage $V_{DD}$ or a source voltage $V_{SS}$) to components within the layout 400. Stacked or non-stacked transistors may be provided on the upper surface of the substrate and used with the BSPDN of FIG. 4. The BSPDN may increase a power delivery efficiency in the layout 400, reduce an area used for power delivery in the layout 400, and/or improve a voltage drop (i.e., IR drop) in the layout 400.

As can be seen, providing a standard cell with a BSPDN may "free" or make available the first and second power tracks 214a, 214b in a FSPDN. These available areas for first and second metal tracks may used instead for block routing metal tracks 414a and 414b, which may be used to provide additional and/or more compact block routing in the layout 400 of FIG. 4. Block routing may refer to the process of establishing connections or pathways between different standard cells or functional components within an integrated circuit. Block routing metal patterns 424a and 424b and vertical vias may be created along the block routing metal tracks 414a and 414b for signals to traverse between various standard cells and components thereof, such as logic gates, memory units, and/or other specialized modules.

The block routing metal tracks 414a and 414b may be contrasted with the lower interconnection tracks 216a-216c, which may also use horizontal metal patterns and vertical vias for signals in the first metal layer 212 to traverse between various components within a standard cell (e.g., within the layout 400 of FIG. 4). Because the lower interconnection tracks 216a-216c are used for interconnections localized to each standard cell, they may be referred to as local interconnection tracks 216a-216c herein.

To maintain signal integrity and avoid crosstalk and parasitic capacitance, careful routing of both lower interconnection metal patterns 220a-220c and block routing metal patterns 424a and 424b are employed during integrated circuit design processes. Limited real estate, especially at metal layers that are relatively close to the substrate of a standard cell may present challenges during routing.

Figure 5:
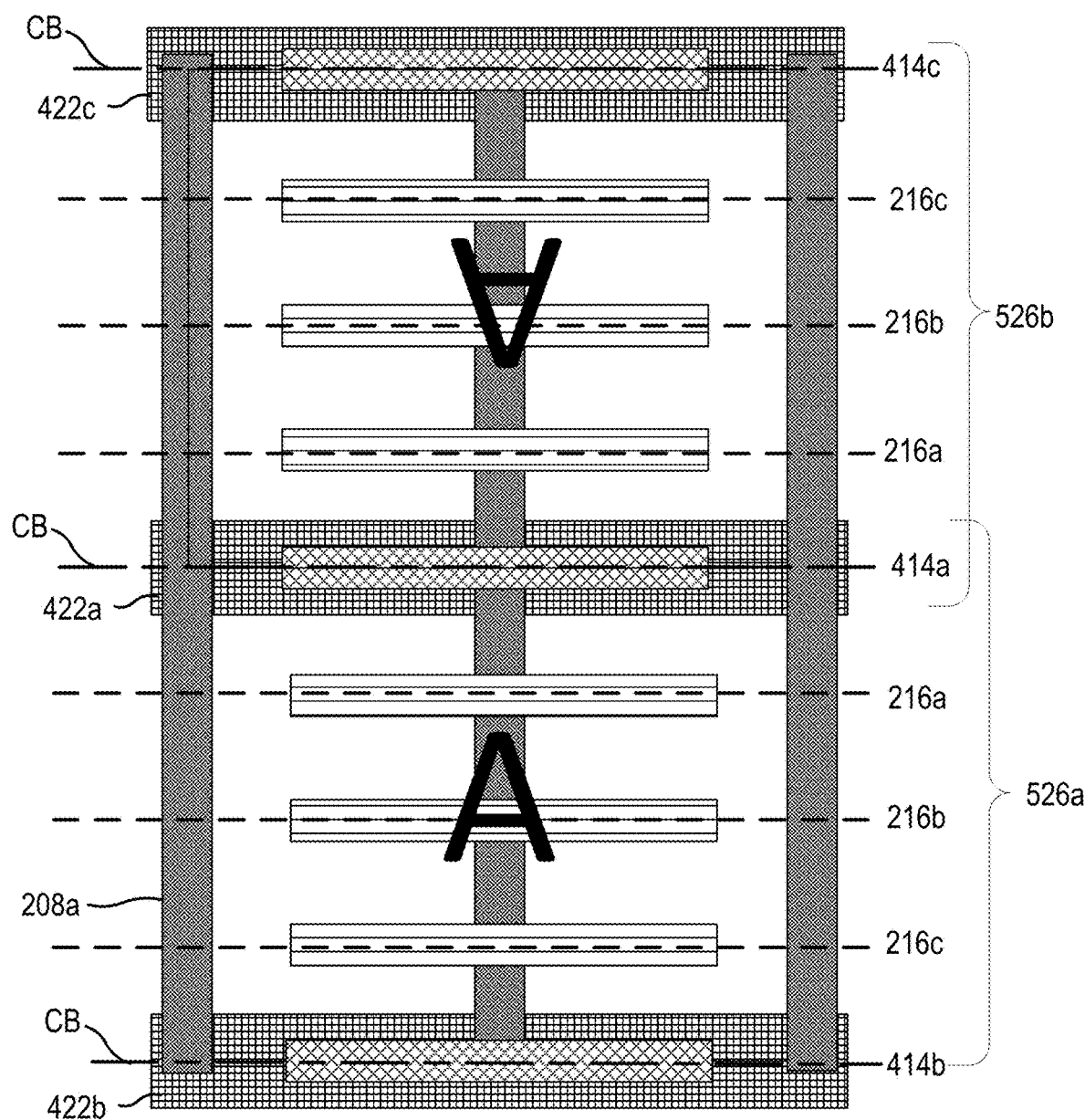
FIG. 5 is a schematic layout of a first standard cell and a second standard cell that is a flipped version of the first standard cell.

In some situations, to provide improved routing efficiency in an integrated circuit, standard cells may be flipped along a horizontal axis. FIG. 5 is an enlarged schematic layout 500 of a first standard cell 526a and a second standard cell 526b that is a flipped version of the first standard cell 526a. The first standard cell 526a may have transistors, gates, and other components that are arranged in a manner A, and the second standard cell 526b may have the transistors, gates, and other components that are arranged in a manner ∀. Stated differently, the layout of the first standard cell 526a may horizontally mirrored or inverted, resulting in the layout of the second standard cell 526b. The first standard cell 526a and the second standard cell 526b may share a common power rail 422a and a common block routing metal track 414a, and may have respective power tracks 414b/414c and respective block routing tracks 414b/414c. Flipping of a standard cell can be done during a design phase of manufacturing or fabricating the integrated circuit. Flipping of a standard cell may be performed to optimize the overall chip layout, improve routing efficiency, and/or meet specific design constraints. In some cases, a flipped standard cell (e.g., the second standard cell 526b) may not be aligned vertically with a non-flipped standard cell (e.g., the first standard cell 526a).

Figure 6:
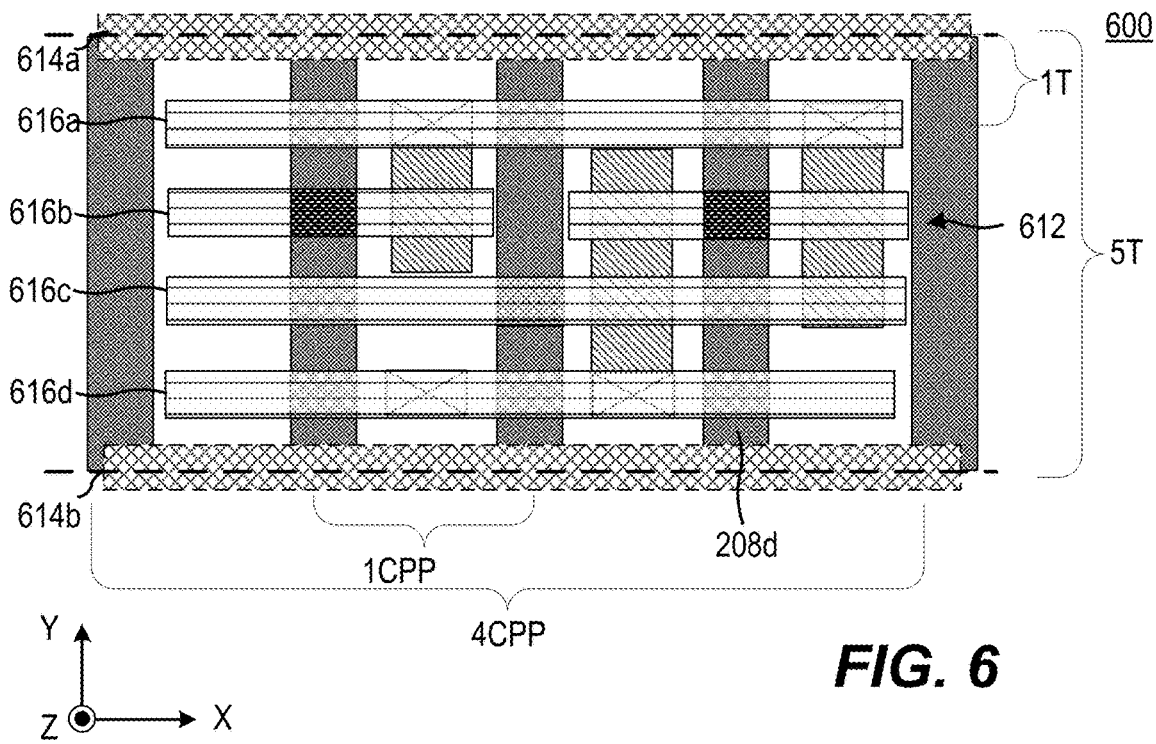
FIGS. 6 and 7 are layouts of standard cells having different horizontal dimensions.
Figure 7:
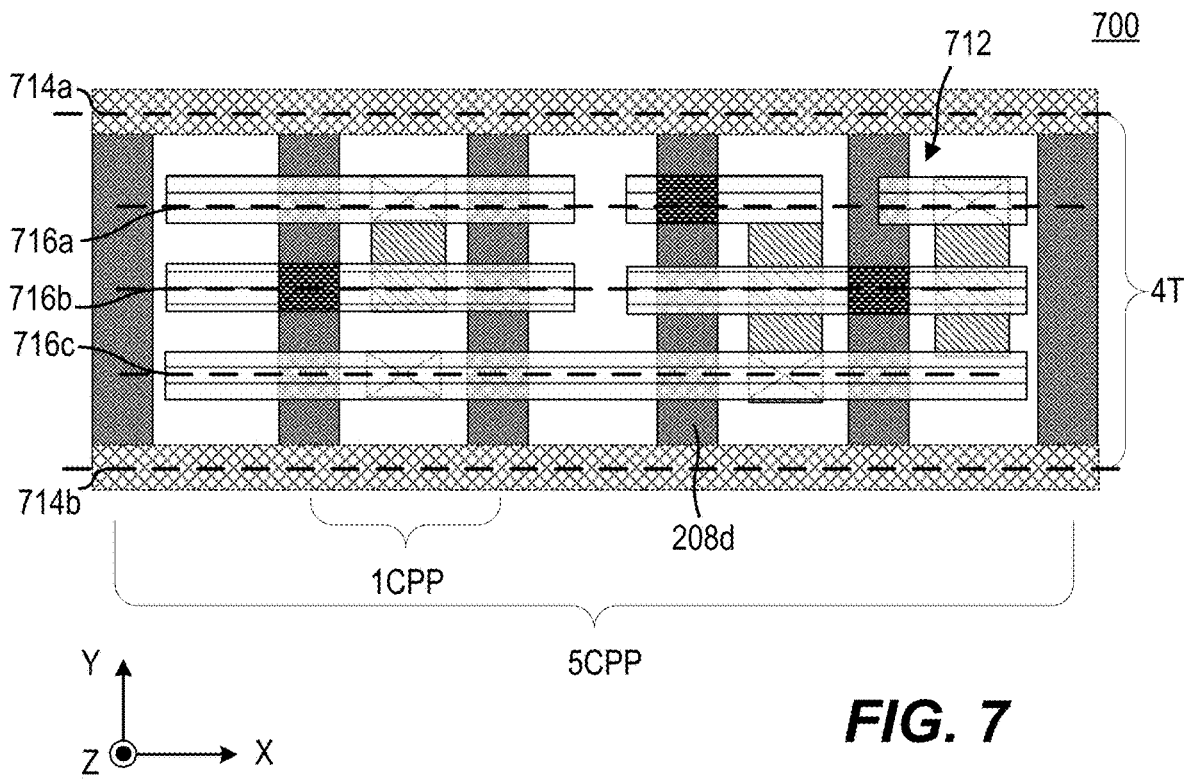

As demands for high performance and/or high speed of an integrated circuit device increase, a degree of integration in the integrated circuit device also increases. One way to increase a degree of integration in an integrated circuit may be to utilize standard cells having smaller dimensions. However, there may be practical limitations reducing a size of a standard cell in a first dimension (e.g., a height of a standard cell) may result in an increase in a size of the standard cell in a second dimension (e.g., a length or width of the standard cell). For example, FIGS. 6 and 7 are example layouts 600, 700 of portions of standard cells that implement an AND-OR-INVERT (AOI) functionality. Not all features or components of the standard cells are shown; for example, buried or backside power rails present in the layout 600 of FIG. 6 and the layout 700 of FIG. 7 are not shown in FIGS. 6 and 7.

Referring to FIGS. 6 and 7, gate lines 208 in the layout 600 and layout 700 may each be spaced apart from each other in the X axis direction by a first contacted poly pitch CPP distance, as measured from a central or midline portion of each gate line 208. Source/drain regions (not shown) may be formed between gate lines 208 extending in the Y axis direction, and contacts may be formed on the source/drain regions. The source/drain regions may include stacked source/drain regions of different conductivity types. For example, a stacked structure may include a first transistor structure on a substrate and comprising a first source/drain region having a first conductivity type and a second transistor structure stacked in a vertical (Z axis) direction on the first transistor structure, the second transistor structure comprising a second source/drain region having a second conductivity type that is opposite from the first conductivity type.

A first metal layer (e.g., M1 metal layer) 612/712 may be provided above (in the Z axis direction) the source/drain regions. As seen in the layout 600 of FIG. 6, the first metal layer 612 may include first and second block routing metal tracks 614a and 614b, and first to fourth lower interconnection tracks (or local interconnection tracks) 616a to 616d. Lower vias (not shown) may also be included in the first metal layer 612. The first and second block routing metal tracks 614a and 614b may extend in length in the X axis direction along cell boundaries of the layout 600 in the Y axis direction. One or more metal patterns may be formed on each of the first and second block routing metal tracks 614*a* and 614*b* and first to fourth lower interconnection tracks 616*a* to 616*d*. The patterns formed in the first metal layer 612 may extend in the X-axis direction.

Each of the block routing tracks 614 and lower interconnection tracks 616 of the first metal layer 612 may be spaced apart in the Y axis direction by a distance T, as measured from a central or midline of each block routing metal track 614*a* and 614*b* (or, put differently, each cell boundary CB in the Y axis direction) and each lower interconnection track 616*a* to 616*d*. Thus, the height in the Y axis direction of the layout 600 may be said to be 5*T, or 5T. As discussed above, the gate lines 208 in the layout 600 may each be spaced apart from each other in the X axis direction by a first contacted poly pitch CPP distance, and the length or width in the X axis direction of the layout 600 may be said to be 4*CPP, or 4CPP.

As seen from a comparison between the layout 600 of FIG. 6 and the layout 700 of FIG. 7, if an attempt is made to reduce a height of the standard cell providing AOI functionality from 5T to 4T (for example, by having only first to third lower interconnection tracks (or lower interconnection tracks) 716*a* to 716*c* between the first and second block routing tracks 714*a* and 714*b* or between the cell boundaries CB in the Y axis direction, the limited ability to provide lower interconnect metal patterns or lower interconnect metal patterns may result in the layout 700 of FIG. 7 having an increased width or length in the X axis direction as compared with the layout 600 of FIG. 6. In other words, the length or width in the X axis direction of the layout 700 of FIG. 7 may be 5*CPP. As the total horizontal or planar area of each standard layout may be the product of the length in the X axis direction and the height in the Y axis direction, in some situations the layout 700 of FIG. 7 may actually have a greater area than the layout 600 of FIG. 6 (e.g., if CPP>T).

Pursuant to the inventive concepts of the present disclosure, integrated circuits and standard cells are provided in which metal tracks at cell boundaries may be used either for lower interconnections (e.g., intra-standard cell interconnections) or for block routing (e.g., inter-standard cell interconnections). Such arrangements may permit standard cells having reduced planar areas, reducing an effective size thereof, increasing integrated circuit density.

Figure 8A:
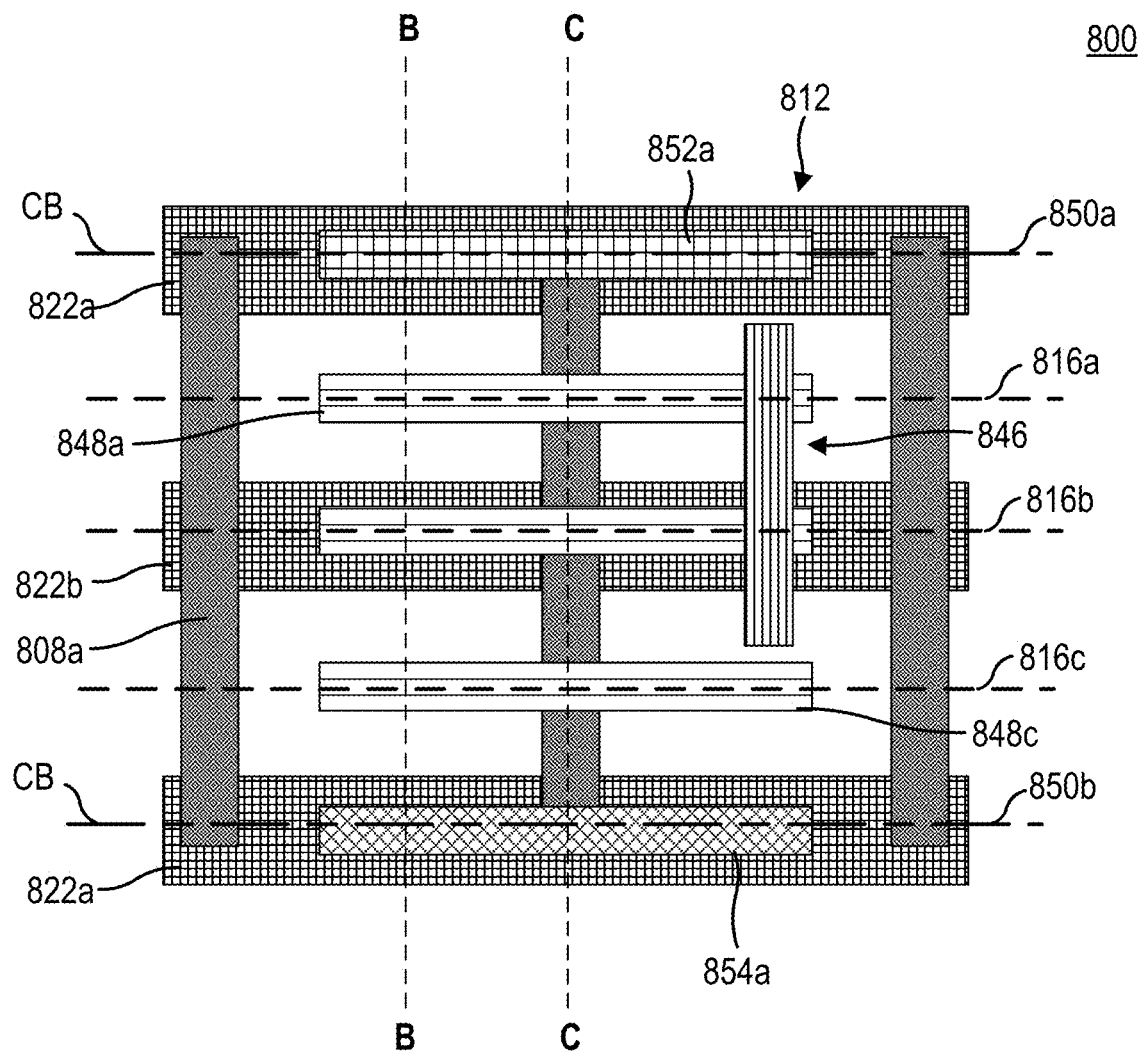
FIG. 8A is a plan view of a standard cell according to some embodiments.
Figure 8A:
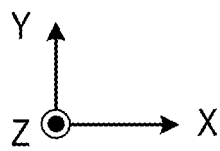
Figure 8C:
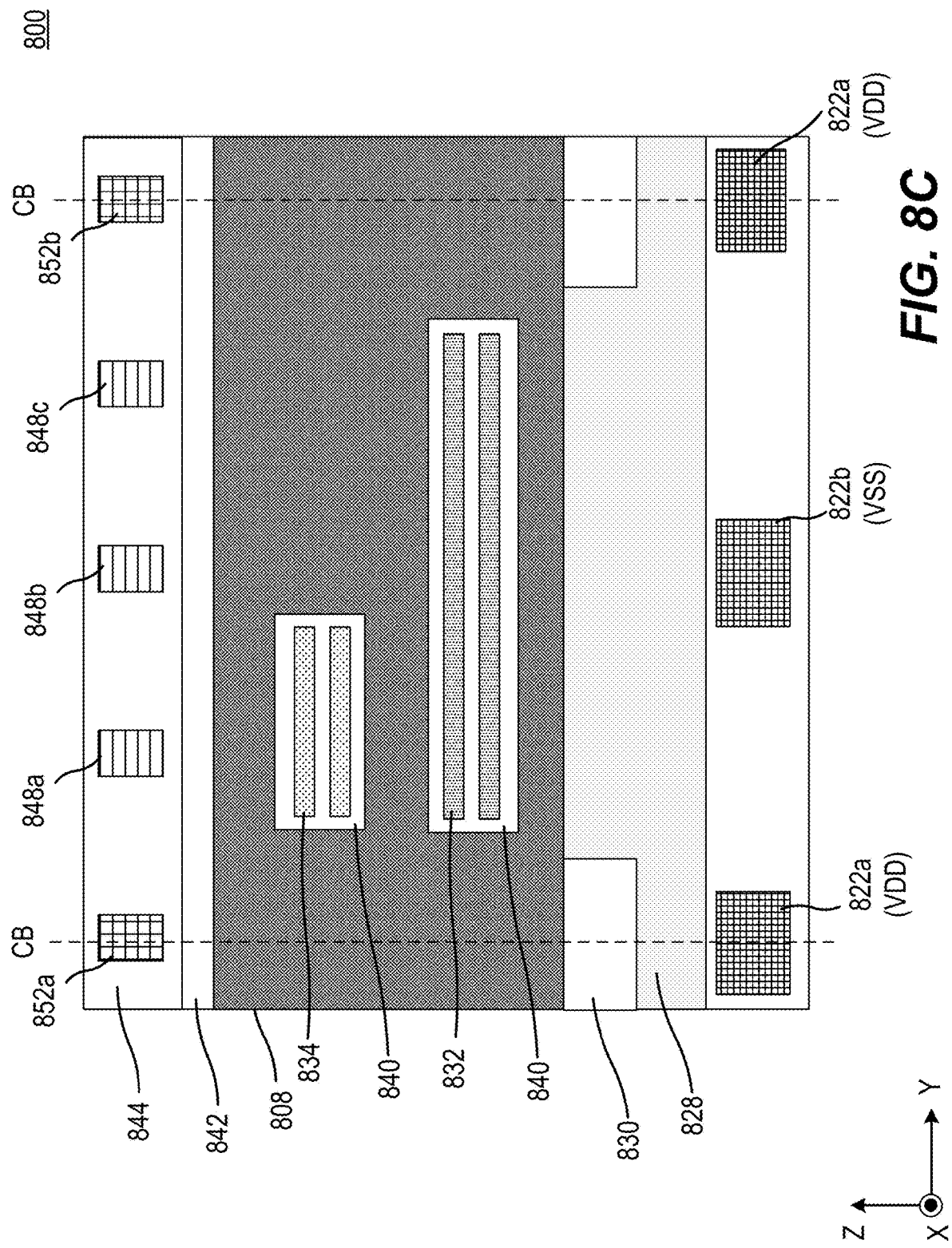

FIGS. 8A, 8B, and 8C are diagrams illustrating a standard cell 800 included in an integrated circuit according to some embodiments of the inventive concepts. FIG. 8A is a plan view of the standard cell 800, and FIGS. 8B and 8C are cross-sectional views taken along lines B-B and C-C of FIG. 8A, respectively. Not all components of the standard cell 800 are shown in the diagrams of FIGS. 8A-8C for simplicity.

Referring to FIG. 8A-8C, the standard cell may include a substrate 828. A lower surface of the substrate 828 may extend in the X axis direction and the Y axis direction. The X axis direction and the Y axis direction may be parallel to the lower surface of the substrate 828.

In some embodiments, the substrate 828 may include or may be insulating material(s), for example, silicon oxide, silicon oxynitride, silicon nitride, silicon carbonitride, silicon boron nitride and/or a low-k material. The low-k material may include, for example, fluorine-doped silicon oxide, organosilicate glass, carbon-doped oxide, porous silicon dioxide, porous organosilicate glass, spin-on organic polymeric dielectrics and/or spin-on silicon based polymeric dielectric. In some other embodiments, the substrate 828 may include or may be semiconductor material(s), for example, Si, Ge, SiGe, GaP, GaAs, SiC, SiGeC and/or InP. For example, the substrate 828 may be insulating layer(s), a bulk substrate (e.g., a bulk silicon wafer) and/or a semiconductor on insulator (SOI) substrate. A thickness of the substrate 828 in the Z axis direction may be in a range of 50 nm to 100 nm, although the present disclosure is not limited thereto.

The substrate 828 may include portions separated from each other by a trench isolation layer 830. The trench isolation layer 830 may include an insulating material(s) (e.g., silicon oxide, silicon oxynitride, silicon nitride, silicon carbonitride, silicon boron nitride and/or a low-k material). A lower channel region 832 and upper channel region 834 may be on a portion of the substrate 828 that is between the trench isolation layers 830.

In some embodiments, each of the lower channel region 832 and the upper channel region 834 may include multiple channel regions stacked in the Z axis direction, and the channel regions may be spaced apart from each other in the Z axis direction. Although FIG. 8C illustrates that each of the lower channel region 832 and the upper channel region 834 includes two channel regions stacked in the Z axis direction, the present disclosure is not limited thereto. In some embodiments, each of the lower channel region 832 and the upper channel region 834 may include more or less than two channel regions stacked in the Z axis direction.

The standard cell 800 may include one or more gate electrodes 808. Although not illustrated, the standard cell 800 may also include one or more gate insulators. Each gate electrode 808 and corresponding gate insulator together may constitute a gate structure. The lower channel region 832 and the upper channel region 834 may extend through the gate electrode 808 in the X axis direction, and the gate insulator may be provided between the gate electrode 808 and each of the lower channel region 832 and the upper channel region 834 to provide insulation therebetween. The gate insulator may contact the gate electrode 808 and/or each of the lower channel region 832 and the upper channel region 834. The gate insulator may separate the gate electrode 808 from the lower channel region 832 and the upper channel region 834. As best illustrated in FIGS. 8C, the gate electrode 808 may extend longitudinally in the Y axis direction and intersect the lower channel region 832 and the upper channel region 834.

The standard cell 800 may also include a pair of lower source/drain regions 836 and a pair of upper source/drain regions 838, with only one lower source/drain region 836 and upper source/drain region 838 shown in the figures. Although not illustrated in FIGS. 8A-8C, the gate electrode 808 may be provided between the pair of lower source/drain regions 836 in the X axis direction and between the pair of upper source/drain regions 838 in the X axis direction. The pair of lower source/drain regions 836 may contact opposing side surfaces of the lower channel region 832 in the X axis direction, respectively. Similarly, the pair of upper source/drain regions 838 may contact opposing side surfaces of the upper channel region 834 in the X axis direction, respectively.

Each of the lower channel region 832 and the upper channel region 834 may include semiconductor material(s) (e.g., Si, Ge, SiGe, GaP, GaAs, SiC, SiGeC and/or InP). In some embodiments, each of the lower channel region 832 and the upper channel region 834 may be a nanosheet that may have a thickness in a range from 1 nanometers (nm) to 100 nm in the Z axis direction or may be a nanowire that may have a circular cross-section with a diameter in a range of from 1 nm to 100 nm.

Each of the pair of lower source/drain regions 836 and the pair of upper source/drain regions 838 may include a semiconductor layer (e.g., a silicon (Si) layer and/or a silicon germanium (SiGe) layer) and may additionally include dopants in the semiconductor layer. In some embodiments, each of the pair of lower source/drain regions 836 and the pair of upper source/drain regions 838 may include a metallic layer that includes, for example, tungsten (W), aluminum (Al), copper (Cu), molybdenum (Mo), cobalt (Co) and/or ruthenium (Ru).

The gate insulator may include a single layer or multiple layers (e.g., an interfacial layer and/or a high-k material layer). For example, the interfacial layer may include a silicon oxide layer, and the high-k material layer may include $Al_2O_3$, $HfO_2$, $ZrO_2$, $HfZrO_4$, $TiO_2$, $Sc_2O_3$, $Y_2O_3$, $La_2O_3$, $Lu_2O_3$, $Nb_2O_5$ and/or $Ta_2O_5$.

The gate electrode 808 may include a single layer or multiple layers. In some embodiments, the gate electrode 808 may include a metallic layer that includes, for example, W, Al, Cu, Mo, Co, and/or Ru.

In some embodiments, a work function layer(s) 840 may be provided between the gate electrode 808 and the gate insulator. In some embodiments, the work function layer(s) 840 may separate the gate electrode 808 from the gate insulator. The work function layer(s) 840 may include, for example, a TiN layer, a TaN layer, a TiAl layer, a TiC layer, a TiAlC layer, a TiAlN layer and/or a WN layer.

A lower transistor may include the lower channel region 832, the pair of lower source/drain regions 836, and a portion of the gate electrode 808. An upper transistor may include the upper channel region 834, the pair of upper source/drain regions 838, and a portion of the gate electrode 808. In some embodiments, the lower transistor may be a N-type metal-oxide semiconductor FET (NMOSFET), and the upper transistor may be a P-type MOSFET (PMOSFET), or vice versa, depending on the specifications of the standard cell 800. Together, the lower transistor and the upper transistor may constitute a stacked FET.

In some embodiments, the gate electrode 808 may be a common gate layer, as illustrated in FIG. 8C. An upper portion of the gate electrode 808 may a gate electrode of the upper transistor including the first upper channel region 834, and a lower portion of the gate electrode 808 may be a gate electrode of the lower transistor including the lower channel region 832. As the gate electrode 808 is shared by the lower transistor and the first and second upper transistors, an input of the standard cell 800 may be applied in common through the gate electrode 808. Although FIG. 8C illustrates that the gate electrode 808 is shared by the lower transistor and the upper transistor, the present disclosure is not limited thereto. In some embodiments, a lower portion of the gate electrode 808 may be separated from and spaced apart from an upper portion of the gate electrode 808. For example, insulating layer(s) may be between the lower and upper portions of the gate electrode 808 and may separate the lower portion of the gate electrode 808 from the upper portion of the gate electrode 808. In this case, the lower portion of the gate electrode 808 may be a first gate electrode of the lower transistor, and the upper portion of the gate electrode 808 may be a second gate electrode of the upper transistor.

In some embodiments, each of the lower transistor and the upper transistor may be a three-dimensional (3D) FET such as a multi-bridge channel FET (MBCFET). In some embodiments, one or more of the lower transistor and the upper transistor may have a structure different from that illustrated. For example, one or more of the lower transistor and the upper transistor may be a gate-all-around FET (GAAFET) including a single channel region or a fin-shaped FET (FinFET).

An interlayer insulating layer 842 may be provided on the substrate 828, and the lower transistor and the upper transistor may be provided in the interlayer insulating layer 842. In particular, the lower channel region 832, the upper channel region 834, the pair of lower source/drain regions 836, the pair of upper source/drain regions 838, and the gate electrode 808 may be provided in the interlayer insulating layer 842.

Although the interlayer insulating layer 842 is illustrated as a single layer, in some embodiments, the interlayer insulating layer 842 may include multiple layers. A lower surface of the interlayer insulating layer 842 may contact an upper surface of the trench isolation layer 830. The interlayer insulating layer 842 may include insulating material(s) (e.g., silicon oxide, silicon oxynitride, silicon nitride, silicon carbonitride, silicon boron nitride and/or a low-k material).

The standard cell 800 may include a back-end-of-line (BEOL) structure that is formed through the BEOL portion of device fabrication. The BEOL structure may include a BEOL insulating layer 844. The BEOL insulating layer may include, for example, silicon oxide, silicon oxynitride, silicon nitride, silicon carbonitride, silicon boron nitride and/or a low-k material.

In addition, the BEOL structure may include a plurality of metal layers, and FIG. 8A illustrates a first metal layer 812 and a second metal layer 846 among the plurality of metal layers. The first metal layer 812 may be a lowermost metal layer of the plurality of metal layers, with reference to the substrate 828, or the closest metal layer of the BEOL structure to the substrate 828. The second metal layer 846 may be a metal layer of the plurality of metal layers that is farther from the substrate 828 than the first metal layer 812. The second metal layer 846 is omitted from FIGS. 8B and 8C.

The standard cell 800 may include a plurality of tracks for each of the plurality of metal layers including the first metal layer 812, and may include patterns extending in a certain direction along the plurality of tracks. For example, the standard cell 800 may include lower interconnection tracks (or local interconnection tracks) 816a, 816b, and 816c, which may be similar to the first to third lower interconnection tracks 216a to 216c shown in FIGS. 2-4.

The standard cell 800 may include one or more metal patterns 848 on each of the lower interconnection tracks (or local interconnection tracks) 816 for transmitting signals (e.g., data signals). For example, each of the lower interconnection tracks may include one or more lower interconnection metal patterns 848 arranged thereon and extending in the X direction and spaced apart from other lower interconnection metal patterns 848 disposed on the same track in the X direction and spaced apart from other lower interconnection metal patterns 848 disposed on other tracks in the Y direction. Each of the lower interconnection metal patterns 848 may be signal metal patterns and referred to as signal metal patterns 848. As discussed above, the metal patterns 848 extending along the plurality of lower interconnection tracks 816 may be lower interconnection patterns that interconnect two or more components or regions are localized within the standard cell 800.

In addition, the standard cell 800 may include one or more cell boundary metal tracks 850 (e.g., a first cell boundary metal track 850a, a second cell boundary track metal 850b), which may include metal patterns that are used for local interconnection within the standard cell 800 and/or metal patterns that are used for block routing to a standard cell (not shown) outside the standard cell 800.

One or more metal patterns 852 may be on each of the cell boundary tracks 850 and used for transmitting signals (e.g., data signals), and hence may be referred to as cell boundary metal patterns 852 or cell boundary signal metal patterns 852. For example, either or both of cell boundary metal patterns 852a and 852b may be metal patterns within the first metal layer 812 and arranged at a cell boundary CB of the standard cell 800. In some embodiments, one or both of the cell boundary tracks 850 arranged at cell boundaries CB of the standard cell 800 may be block routing patterns 852 that interconnect the standard cell 800 with a different standard cell of the integrated circuit.

The plurality of metal tracks, including the cell boundary metal tracks 850 and the lower interconnection metal tracks 816 may extend in parallel to each other in the X axis direction and may be spaced apart from each other in the Y axis direction.

The metal patterns 848 and 852 formed in each of the plurality of metal layers may include a metal, a conductive metal nitride, a metal silicide, or a combination thereof. In the drawings herein, only some layers may be shown for convenience of illustration, and vias may be not shown even though the via is located under the pattern of the metal layer.

The standard cell 800 may also include a backside power distribution network structure (BSPDN) 856. The BSPDN 856 may contact the lower surface of the substrate 828. The BSPDN 856 may include a backside insulator 858, and first and second power lines 822a and 822b may be provided in the backside insulator. The BSPDN 856 may include a power delivery network including the first and second power lines 822a and 822b. The first and second power lines 822a and 822b may each be electrically connected to a power source with a predetermined voltage (e.g., a drain voltage $V_{DD}$ or a source voltage $V_{SS}$), which may be used to provide power to e.g., the pair of lower source/drain regions 836 and the pair of upper source/drain regions 838. In some embodiments, more than one of the first and second power lines 822a and 822b may be provided in the standard cell 800. For example, the standard cell 800 may include two of the first power lines 822a and one of the second power lines 822b. Stated differently, the number of the first power lines 822a may be unequal to the number of the second power lines 822b. The first and second power lines 822a and 822b may be electrically connected to the pair of lower source/drain regions 836 or the pair of upper source/drain regions 838 through conductive via(s) and/or contact structure(s), such as contact structure 860, which in some embodiments may extend through or penetrate the substrate 828.

The BSPDN 856 may include one or more conductive layers (e.g., metal layers) stacked in the Z axis direction that provide power delivery. The conductive layers may be respectively included in insulating layers such as backside insulator 858, and conductive via plugs (e.g., metal via plugs) may electrically connect the conductive layers to each other in the Z axis direction. For example, the backside insulator of the BSPDN 856 may include multiple layers stacked on the lower surface of the substrate 828. The conductive layers may include one or more conductive wires (e.g., metal wires). In some embodiments, an intervening structure may be provided between the substrate 828 and the BSPDN 856 and may separate the substrate 828 from the BSPDN 856. The BSPDN 856 may increase a power delivery efficiency in the standard cell 800, reduce an area used for power delivery in the standard cell 800, and/or improve a voltage drop (i.e., IR drop) in the standard cell 800.

Figure 9:
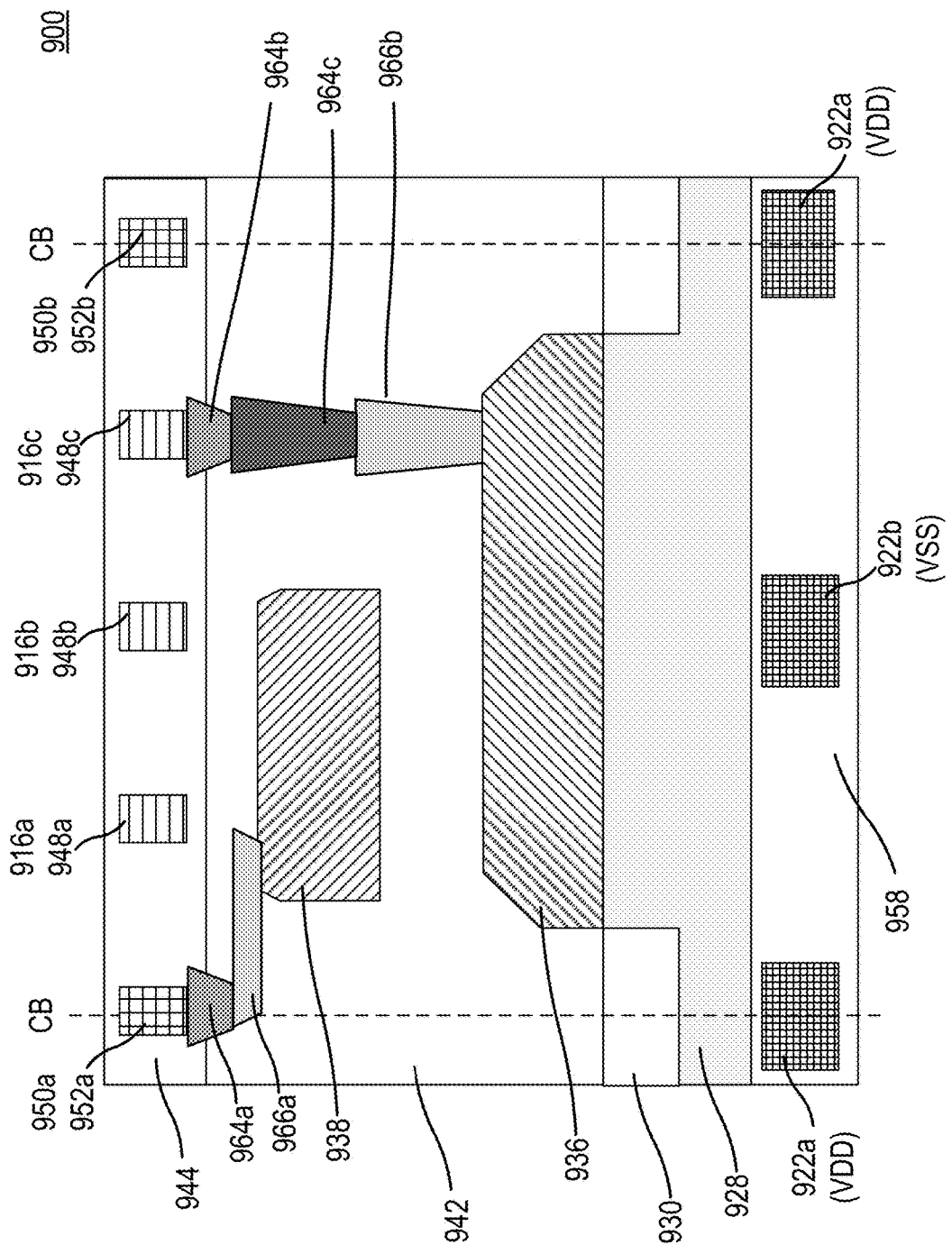
FIGS. 9 and 10 are cross-sectional views of standard cells taken along the lines B-B in FIG. 8A, according to some embodiments.

FIG. 9 is a cross sectional view of a layout 900 according to some embodiments of the present disclosure, showing that the upper transistor (and more specifically, one of the pair of upper source/drain regions 938 thereof) may be connected to a cell boundary metal pattern 952a in a cell boundary metal track 950a that overlaps (in the Z axis direction) the cell boundary CB that extends in the X axis direction on a Y axis side of the layout 900. At the same time, the lower transistor (and more specifically, one of the pair of lower source/drain regions 936 thereof) may be connected to a lower interconnection metal pattern 948c in a lower interconnection track 916c that does not overlap one of the cell boundaries CB of the layout 900. As also seen the cell boundary metal pattern 952a may overlap one of the first power lines 922a in the Z axis direction.

The upper source/drain region 938 may be connected to the cell boundary metal pattern 952a by way of a first via 964a and a first source/drain contact 966a. The lower source/drain region 936 may be connected to the lower interconnection metal pattern 948c by way of a second via 964b, third via 964c, and second source/drain contact 966b. In some embodiments, the second and third via 964b and 964c may be formed as a single via.

Figure 10:
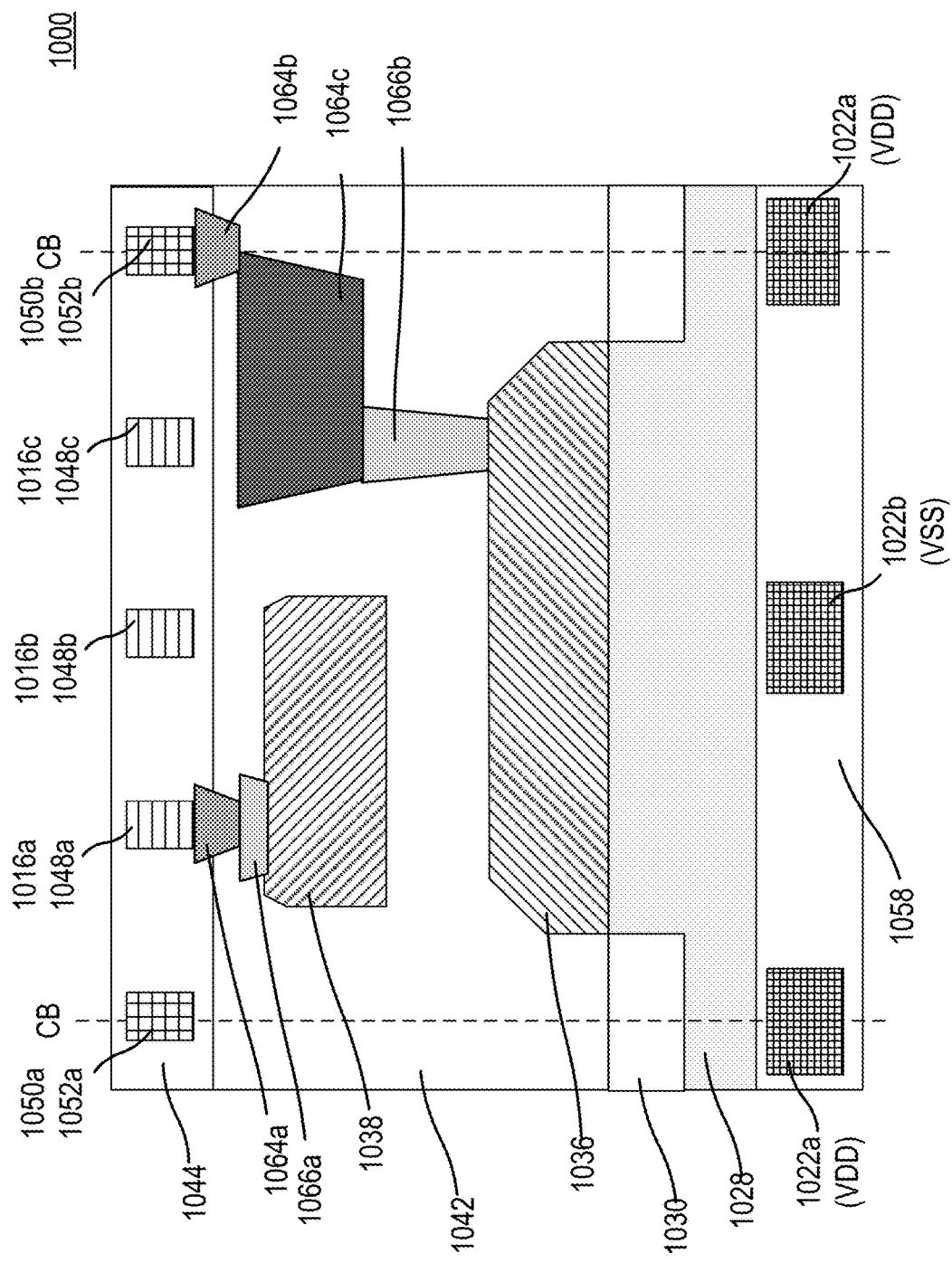

FIG. 10 is a cross sectional view of a layout 1000 according to some embodiments of the present disclosure, showing that the lower transistor (and more specifically, one of the pair of lower source/drain regions 1036 thereof) may be connected to a cell boundary metal pattern 1052b in a cell boundary metal track 1050b that overlaps (in the Z axis direction) the cell boundary CB that extends in the X axis direction on a Y axis side of the layout 1000. At the same time, the upper transistor (and more specifically, one of the pair of upper source/drain regions 1038 thereof) may be connected to a lower interconnection metal pattern 1048a in a lower interconnection track 1016a that does not overlap one of the cell boundaries CB of the layout 1000. As also seen the cell boundary metal pattern 1052a may overlap one of the first power lines 1022a in the Z axis direction.

The upper source/drain region 1038 may be connected to the lower interconnection metal pattern 1048a by way of a first via 1064a and a first source/drain contact 1066a. The lower source/drain region 1036 may be connected to the cell boundary metal pattern 1052b by way of a second via 1064b, third via 1064c, and second source/drain contact 1066b. In some embodiments, the second and third via 1064b and 1064c may be formed as a single via.

FIG. 11 is an example layout 1100 of portions of a standard cell that implements an AND-OR-INVERT (AOI) functionality, and may be compared with the layout 600 of FIG. 6 and the layout 700 of FIG. 7. Not all features or components of the standard cell of layout 1100 are shown; for example, buried or backside power rails present in the layout 1100 of FIG. 11 are not shown in FIG. 11.

Referring to FIG. 11, gates 1108 in the layout 1100 may each be spaced apart from each other in the X axis direction by a first contacted poly pitch CPP distance, as measured from a central or midline portion of each gate 1108. In the first metal layer 1112, three lower interconnection tracks 1116 of the first metal layer 1112 may be spaced apart in the Y axis direction by a distance T, as measured from a central or midline of each lower interconnection track 1116. Additionally, a cell boundary metal track 1150a extending in the X axis direction over a first cell boundary CB in the Y axis direction may be used for lower interconnection and a lower interconnection metal pattern may be formed therein. A cell boundary track 1150 extending in the X axis direction over a second cell boundary CB in the Y axis direction may be used for block routing. Thus, the layout 1100 may have four metal tracks used for lower interconnection including lower interconnection metal tracks 1116*a* to 1116*c* and cell boundary metal track 1150*a*.

The height in the Y axis direction of the layout 1100 may be said to be 4*T, or 4T. As discussed above, the gates 1108 in the layout 1100 may each be spaced apart from each other in the X axis direction by a first contacted poly pitch CPP distance, and the length or width in the X axis direction of the layout 1100 may be said to be 4*CPP, or 4CPP. Accordingly, the layout 1100 may have a reduced planar area as compared with the layout 600 of FIG. 6 and the layout 700 of FIG. 7.

Figure 12:
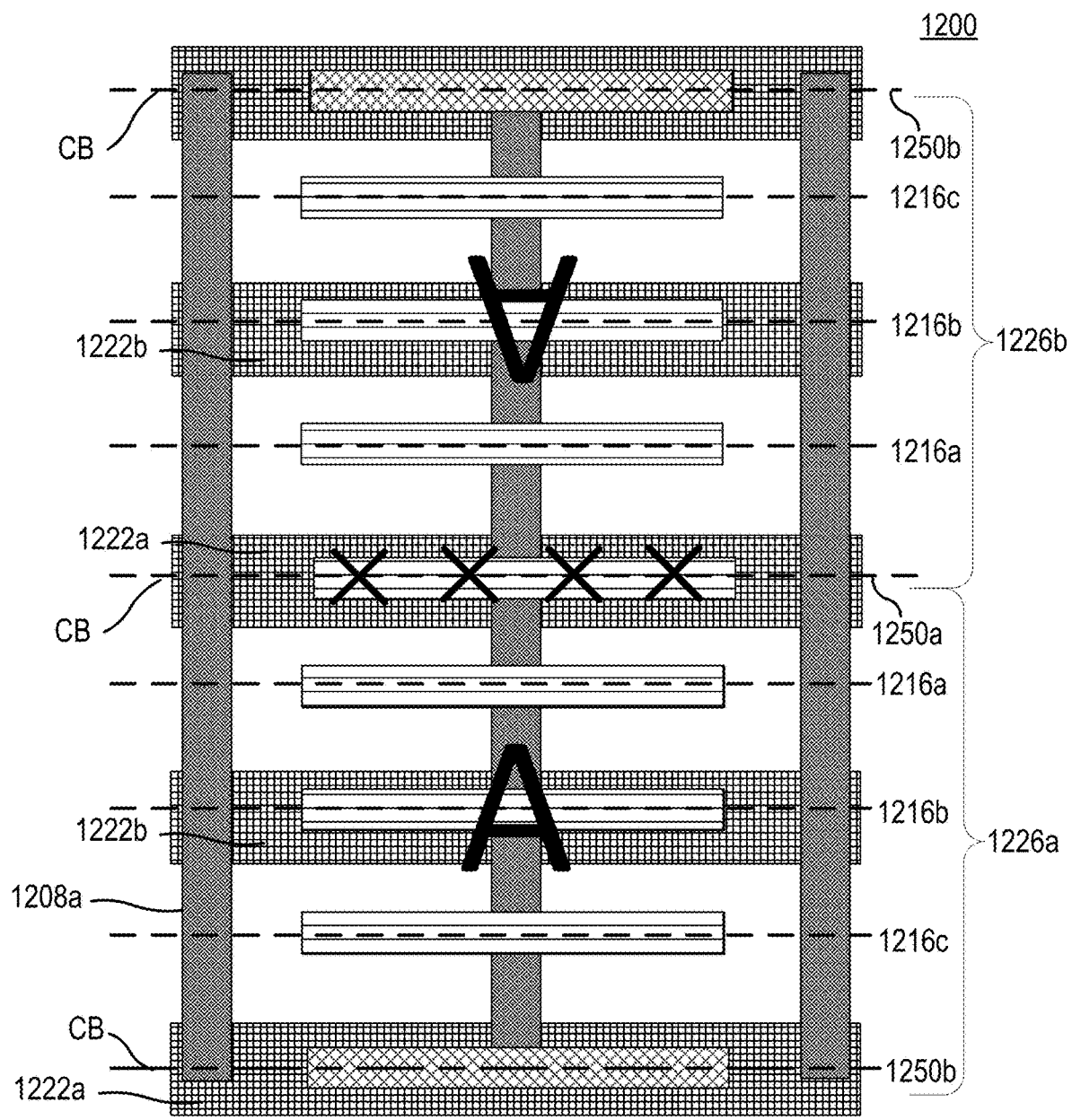
FIGS. 12 and 13 are schematic layout views each showing a first standard cell and a second standard cell that is a flipped version of the first standard cell.
Figure 13:
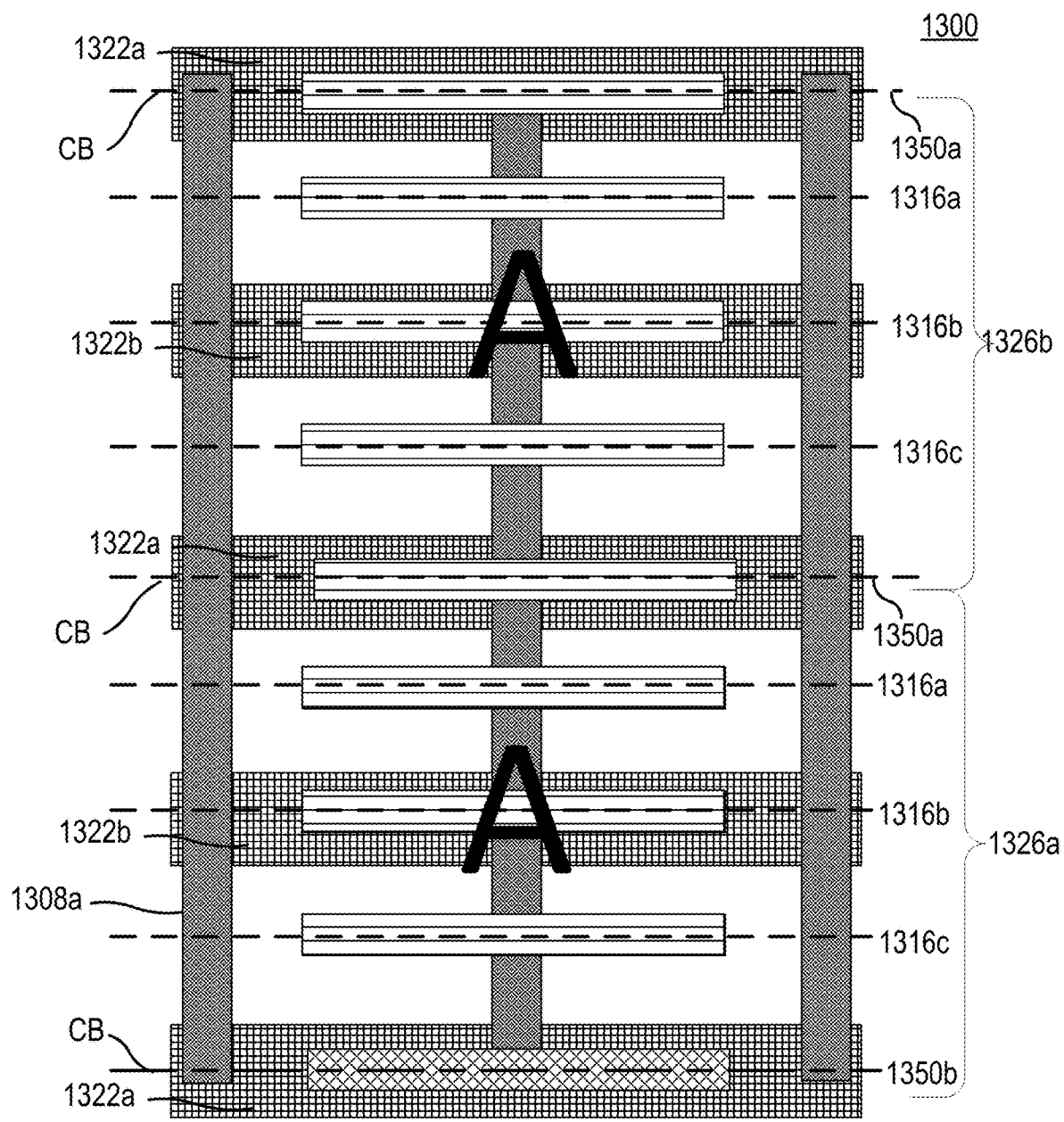

It may be recognized that using one or both of the cell boundary metal tracks (e.g., cell boundary metal tracks 850 of FIGS. 8A-8C) may create conflicts when flipping and placing a standard cell. For example, FIG. 12 shows a layout 1200 of a first standard cell 1226*a* and a second standard cell 1226*b* that is a flipped version of the first standard cell 1226*a*. The first standard cell 1226*a* may have therein one or more metal patterns in a cell boundary metal track 1250*a* thereof, and flipping and placing the second standard cell 1226*b* so as to share a common power rail 122 may result in the second standard cell 1226*b* having one or more metal patterns in a cell boundary metal track 1250*c* thereof. Attempting to place the first and second standard cells 1226*a* and 1226*b* as in the layout 500 of FIG. 5 may result in a conflict, as the metal patterns in the cell boundary metal track 1250*a* and the cell boundary metal track 1250*c* may interfere with or overlap each other incorrectly. However, and with reference to FIG. 13 and the layout 1300 therein, the providing of two or more first power lines 1322*a* (or two or more second power lines 1322*b*) may result in the standard cell 1326*a* having power lines 1322*a* with the same potential at first and second cell boundaries CB thereof that are opposite each other across the standard cell 1326*a*. Thus, flipping the first standard cell 1326*a* twice, or conversely, not flipping the first standard cell 1326*a* at all to produce the second standard cell 1326*b* will nevertheless permit the first and second standard cells 1326*a* and 1326*b* to be placed such that the first and second standard cells 1326*a* and 1326*b* share a common power rail, as seen in FIG. 13.

Figure 14:
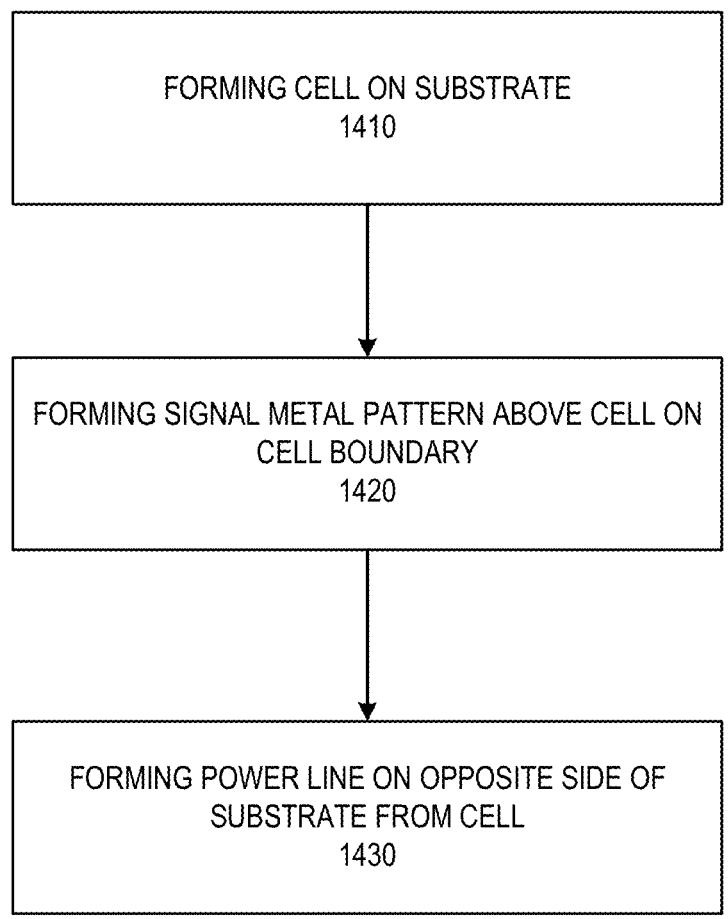
FIG. 14 is a flow chart of methods of forming a device according to some embodiments.

FIG. 14 is a flow chart of methods of forming an integrated circuit device according to some embodiments.

Referring to FIGS. 14 and 8A-8C, a cell may be formed on a substrate (e.g., substrate 828 of FIGS. 8A-8C) (BLOCK 1410). Forming the cell may include forming the lower channel region 832 may be formed on the substrate 828. The lower channel region 832 may be alternately stacked in the third direction Z with portions of a sacrificial layer (not shown). An upper channel region 834 may be formed on the lower channel region. The lower channel region 832 may be between the substrate 828 and the upper channel region 834. The upper channel region 834 may be alternately stacked in the third direction Z with portions of the sacrificial layer.

The sacrificial layer may include a material having an etch selectivity with respect to the lower channel region 832 and the upper channel region 834. The sacrificial layer may include, for example, semiconductor material(s) (e.g., Si, Ge, SiGe, GaP, GaAs, SiC, SiGeC and/or InP). In some embodiments, the sacrificial layer may include a SiGe layer.

The sacrificial layer may be removed and replaced with the gate electrode 808 and the gate insulator. For example, the sacrificial layer may be selectively removed by an etching process (e.g., a dry etching process and/or wet etching process) without removing the lower channel region 832 and the upper channel region 834.

In some embodiments, the work function layer(s) 840 may be provided between the gate electrode 808 and the gate insulator. In some embodiments, the work function layer(s) 840 may extend between the gate electrode 808 and the gate insulator and may separate the gate electrode 808 from the gate insulator.

Forming the cell may include forming the pair of lower source/drain regions 836. The pair of lower source/drain regions 836 may be formed, for example by performing an epitaxial growth process using the lower channel region 832 as a seed layer. Specifically, the pair of lower source/drain regions 836 may be grown from opposing side surfaces of the lower channel region 832 in the first direction X, respectively, through the epitaxial growth process. A first lower source/drain region 836 may be grown from a first side surface of the lower channel region 832, and a second lower source/drain region 836 may be grown from a second side surface of the lower channel region 832 that opposes the first side surface in the first direction X.

Forming the cell may include forming the pair of upper source/drain regions 838. The pair of upper source/drain regions 838 may be formed by performing an epitaxial growth process using the upper channel region 834 as a seed layer. Specifically, the pair of upper source/drain regions 838 may be grown from opposing side surfaces of the upper channel region 834 in the first direction X, respectively, through the epitaxial growth process. A first upper source/drain region 838 may be grown from a first side surface of the upper channel region 834, and second upper source/drain region 838 may be grown from a second side surface of the upper channel region 834 that opposes the first side surface in the first direction X.

Referring to FIGS. 14, 8A-8C, 9, and 10, a BEOL structure may be formed above the cell, and may include a plurality of metal layers and metal patterns arranged along tracked therein. The metal patterns may include lower interconnection metal patterns A signal metal pattern 852 may be formed above the cell on a cell boundary CB thereof (BLOCK 1420). The signal metal pattern 852 may be formed in a cell boundary metal track 850. Referring to FIG. 8A, the BEOL structure may include a first metal layer 812 and a second metal layer 846 among the plurality of metal layers, and the signal metal pattern 852 may be formed on the cell boundary metal track 850 in the first (lowermost) metal layer 812. Additionally, forming the BEOL structure and the plurality of metal layers and metal patterns may include forming contacts and vias (e.g., contacts 966 and/or vias 964) to connect the cell boundary metal pattern 852 with one or more of the upper source/drain regions 838 and the lower source/drain regions 838. For example, FIG. 9 shows the upper source/drain region 938 connected to the cell boundary metal pattern 952*a*, and FIG. 10 shows the lower source/drain region 1036 connected to the cell boundary metal pattern 1052*b*, with the understanding that the present disclosure is not limited thereto.

Referring to FIGS. 14, 8A-8C, 9, and 10, a BSPDN 856 including the first and second power lines 822*a* and 822*b* may be formed, and may be formed on a side of the substrate 828 that is opposite from the cell (BLOCK 1430). Central portions of at least some of the first and second power lines 822*a* and 822*b* in the second direction Y may define or extend cell boundaries CB.

Figure 15:
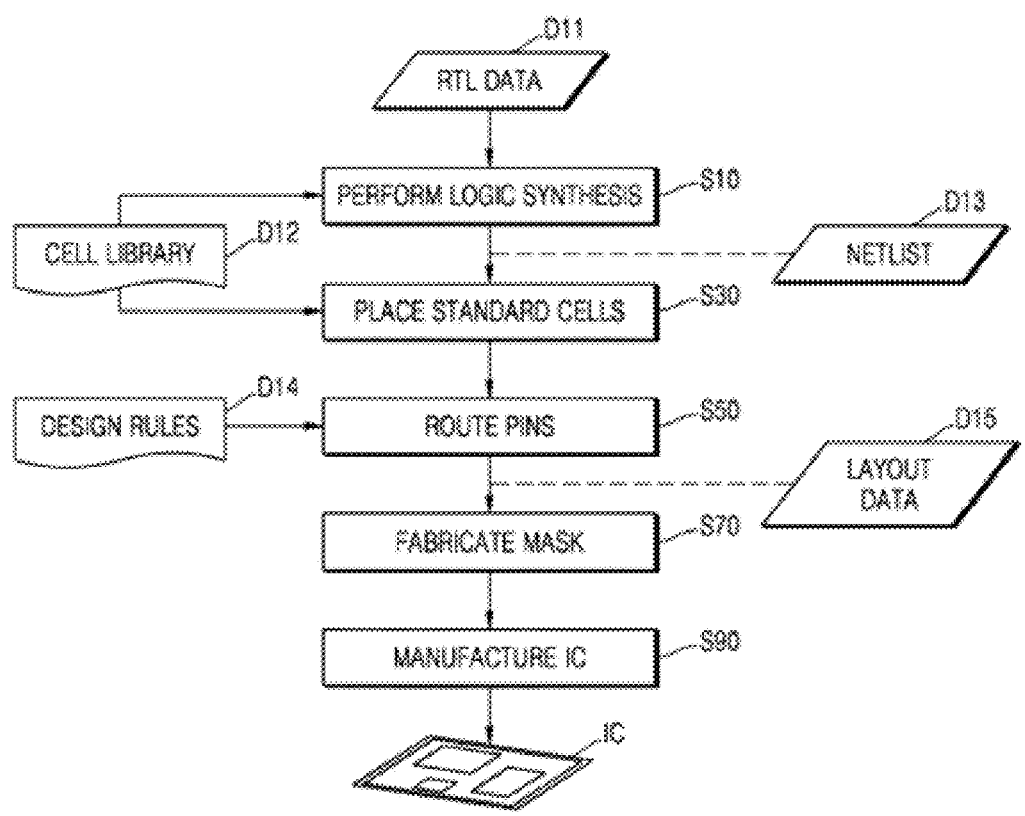
FIG. 15 is a flowchart of a method of fabricating an integrated circuit, according to some embodiments.

FIG. 15 is a flowchart of a method 1500 of manufacturing an IC, according to an some embodiments. In detail, the flowchart of FIG. 15 shows an example of a method of manufacturing an IC including standard cells. As shown in FIG. 15, the method of manufacturing an IC may include operations S10, S30, S50, S70, and S90. As shown, a cell library (or a standard cell library) D12 may include information about standard cells, e.g., information about functions, characteristics, layouts, or the like of standard cells. In some embodiments, the cell library D12 may define a standard cell that utilizes at least one boundary metal track as a lower interconnection track or boundary wiring layer as a lower interconnection wiring layer.

Design rules D14 may include requirements for the layout of an IC. For example, the design rules D14 may include requirements for the spacing between patterns in one layer, the minimum width of a pattern, the routing direction of a wiring layer, and the like. In some embodiments, the design rules D14 may define a minimum spacing in a track of a wiring layer.

Logic synthesis, by which a netlist D13 is generated from RTL data D11, may be performed in operation S10. For example, a semiconductor design tool (e.g., a logic synthesis tool) may perform logic synthesis on the RTL data D11, which is written in very high speed IC (VHSIC) hardware description language (HDL) (VHDL) and HDL like Verilog, with reference to the cell library D12, and generate the netlist D13. The netlist D13 may correspond to the input of placement and routing, which is described below.

Cells may be placed in operation S30. For example, a semiconductor design tool (e.g., a P&R tool) may place standard cells, which are used in the netlist D13, with reference to the cell library D12. In some embodiments, a semiconductor design tool may select a standard cell from the cell library D12 and place the selected standard cell. The pins of the standard cells may be routed in operation S50. For example, a semiconductor design tool may generate interconnections that electrically connect the output and input pins of placed standard cells and generate layout data D15 that defines the placed standard cells and the interconnections. An interconnection may include a via of a via layer and/or a pattern of a wiring layer. In some embodiments, interconnections may include a pattern that connects heterogeneous devices to each other. For example, the layout data D15 may has a format like GDSII and include geometrical information of cells and interconnections. A semiconductor design tool may refer to the design rules D14 while routing the pins of cells. The layout data D15 may correspond to the output of placement and routing. Operation S50 may be solely or operations S30 and S50 may be collectively referred to as a method of designing an IC.

A mask may be fabricated in operation S70. For example, optical proximity correction (OPC) for correcting distortion, such as refraction, caused by the characteristics of light in photolithography may be performed on the layout data D15. Patterns on a mask may be defined to form patterns arranged in a plurality of layers, based on data that has undergone OPC, and at least one mask (or photomask) for forming patterns of each layer may be fabricated. In some embodiments, the layout of an IC may be limitedly modified in operation S70. Limitedly modifying an IC in operation S70 may be post processing for optimizing the structure of the IC and referred to as design polishing.

An IC may be manufactured in operation S90. For example, an IC may be manufactured by patterning a plurality of layers by using at least one mask, which is fabricated in operation S70. For example, FEOL may include planarizing and cleaning a wafer, forming a trench, forming a well, forming a gate electrode, and forming a source and a drain. Individual devices, e.g., transistors, capacitors, resistors, etc., may be formed in a substrate via the FEOL. BEOL (back end-of-the-line) may include silicidation of a gate and source and drain regions, adding a dielectric, planarization, forming a hole, adding a metal layer, forming a via, and forming a passivation layer. The individual devices, e.g., transistors, capacitors, resistors, etc., may be interconnected with each other via the BEOL. In some embodiments, MOL may be performed between FEOL and BEOL such that contacts may be formed on individual devices. Thereafter, the IC may be packaged in a semiconductor package and used as a component of various applications.

Example embodiments are described herein with reference to the accompanying drawings. Many different forms and embodiments are possible without deviating from the teachings of this disclosure and so the disclosure should not be construed as limited to the example embodiments set forth herein. Rather, these example embodiments are provided so that this disclosure will be thorough and complete, and will convey the scope of the present invention to those skilled in the art. In the drawings, the sizes and relative sizes of layers and regions may be exaggerated for clarity. Like reference numbers refer to like elements throughout.

Example embodiments are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, embodiments herein should not be construed as limited to the particular shapes illustrated herein but may include deviations in shapes that result, for example, from manufacturing. Although an element is illustrated as a single layer in the drawings, that element may include multiple layers.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "connected" or "on" another element, it can be directly connected or on the other element, or intervening elements may also be present. In contrast, when an element is referred to as being "directly connected" or "directly on" another element, there are no intervening elements present. As used herein, the term "and/or" includes any and all combinations of one or more of the associated listed items. Moreover, the symbol "/" (e.g., when used in the term "source/drain") will be understood to be equivalent to the term "and/or."

It will be understood that although the terms "first," "second," etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is turned over, elements described as "below" or "beneath" other elements or features would then be oriented "above" the other elements or features. Thus, the term "below" can encompass both an orientation of above and below. The device may be otherwise oriented (e.g., rotated 90 degrees or at other orientations) and the spatially relative descriptors used herein may be interpreted accordingly.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

The above-disclosed subject matter is to be considered illustrative, and not restrictive, and the appended claims are intended to cover all such modifications, enhancements, and other embodiments, which fall within the scope of the present invention. Thus, to the maximum extent allowed by law, the scope is to be determined by the broadest permissible interpretation of the following claims and their equivalents, and shall not be restricted or limited by the foregoing detailed description.

What is claimed is:

1. An integrated circuit device comprising:
   a substrate;
   a cell comprising a plurality of transistors, the plurality of transistors including an upper transistor comprising an upper channel region, and the plurality of transistors including a lower transistor between the substrate and the upper transistor, the lower transistor comprising a lower channel region;
   a power line extending longitudinally in a first horizontal direction below the substrate and defining a cell boundary of the cell that extends longitudinally in the first horizontal direction; and
   a cell boundary signal metal pattern on the cell and extending longitudinally in the first horizontal direction over the cell boundary and connected to at least two transistors of the plurality of transistors,
   wherein the power line is a first power line and the cell boundary defined thereby is a first cell boundary of the cell, the integrated circuit device further comprising a second power line extending longitudinally in the first horizontal direction parallel to the first power line, the second power line defining a second cell boundary of the cell that extends longitudinally in the first horizontal direction, and
   wherein the first power line and the second power line are configured to carry a power signal having a same supply voltage.

2. The integrated circuit device of claim 1, further comprising:
   a back-end-of-line (BEOL) structure comprising a plurality of metal layers on the cell, wherein the cell boundary signal metal pattern is in a first metal layer of the plurality of metal layers that is closest to the substrate.

3. The integrated circuit device of claim 1, wherein the cell boundary signal metal pattern is arranged along a cell boundary metal track that extends longitudinally over the cell boundary, the integrated circuit device further comprising a plurality of lower interconnection metal tracks that extend in parallel with the cell boundary signal metal pattern in the first horizontal direction and are spaced apart from each other and from the cell boundary in a second horizontal direction that intersects the first horizontal direction.

4. The integrated circuit device of claim 1, further comprising a third power line extending horizontally in the first horizontal direction and spaced apart in the second horizontal direction between the first and second power lines, the third power line configured to carry a power signal having a different supply voltage than the first power line.

5. The integrated circuit device of claim 1, wherein the integrated circuit device comprises a plurality of cells and the cell is a first cell of the plurality of cells, the further comprising a block routing metal pattern on the first cell and extending longitudinally in the first horizontal direction over the second cell boundary, the block routing metal pattern connected between a transistor of the first cell and another cell of the integrated circuit device.

6. The integrated circuit device of claim 1, wherein the upper transistor or the lower transistor is electrically connected to the power line by way of a via that extends through the substrate.

7. An integrated circuit device comprising:
   a cell comprising a plurality of transistors arranged on a first side of a substrate, the plurality of transistors including an upper transistor comprising an upper source/drain region, and the plurality of transistors including a lower transistor between the substrate and the upper transistor, the lower transistor comprising a lower source/drain region;
   a back-end-of-line (BEOL) structure comprising a plurality of metal layers on the first side of the substrate, the upper transistor and lower transistor between a lowermost metal layer of the plurality of metal layers and the substrate; and
   first and second power lines extending longitudinally in a first horizontal direction in parallel on a second side the substrate, the first power line and the second power line defining respectively a first cell boundary and a second cell boundary of the cell,
   wherein the lowermost metal layer comprises a cell boundary signal metal pattern that extends longitudinally in the first horizontal direction over the first cell boundary and is connected to at least two transistors of the plurality of transistors, and
   wherein the first and second power lines are configured to provide a same supply voltage to the cell.

8. The integrated circuit device of claim 7, wherein the cell boundary signal metal pattern is arranged along a first cell boundary metal track that extends longitudinally over the first cell boundary.

9. The integrated circuit device of claim 8, wherein the cell is a first cell, the integrated circuit device further comprising a block routing metal signal that is arranged along a second cell boundary metal track that extends longitudinally over the second cell boundary and is connected to a second cell of the integrated circuit device.

10. The integrated circuit device of claim 7, wherein the cell boundary signal metal pattern is electrically connected to the upper source/drain region.

11. The integrated circuit device of claim 7, wherein the cell boundary signal metal pattern is electrically connected to the lower source/drain region.

12. The integrated circuit device of claim 7, further comprising a third power line extending horizontally in the first horizontal direction and spaced apart in a second horizontal direction between the first and second power lines, the second horizontal direction intersecting the first horizontal direction, the third power line configured to carry a power signal having a different supply voltage than the first power line.

13. The integrated circuit device of claim 7, wherein the lower transistor is a N-type metal-oxide semiconductor field effect transistor (NMOSFET), and the upper transistor is a P-type metal-oxide semiconductor field effect transistor (PMOSFET).

14. A method of forming an integrated circuit device, the method comprising:
    forming a cell on a substrate, the cell comprising a plurality of transistors including a lower transistor and an upper transistor on the substrate, the lower transistor comprising a lower channel region and the upper transistor comprising an upper channel region, and the cell comprising a cell boundary that extends in a first horizontal direction;
    forming a cell boundary metal pattern in a first metal layer above the substrate, the cell boundary metal pattern extending in the first horizontal direction and overlapping the cell boundary in a vertical direction, and the cell boundary metal pattern interconnecting at least two transistors of the plurality of transistors, the cell boundary metal pattern connected to at least one of the lower transistor and upper transistor; and
    forming a power line extending longitudinally in the first horizontal direction, the cell boundary metal pattern overlapping the power line and the cell boundary in the vertical direction,
    wherein the power line is a first power line and the cell boundary is a first cell boundary of the cell, the method further comprising forming a second power line extending longitudinally in the first horizontal direction parallel to the first power line, the second power line overlapping a second cell boundary of the cell that extends longitudinally in the first horizontal direction and spaced apart from the first cell boundary in a second horizontal direction that intersects the first horizontal direction, and
    wherein the first power line and the second power line are configured to carry a power signal having a same supply voltage.

15. The method of claim 14, wherein the cell boundary metal pattern is electrically connected to an upper source/drain region of the upper transistor.

16. The method of claim 14, wherein the cell boundary metal pattern is electrically connected to a lower source/drain region of the lower transistor.

* * * * *